(12) United States Patent
Morita

(10) Patent No.: US 6,628,274 B1
(45) Date of Patent: Sep. 30, 2003

(54) DISPLAY DRIVE DEVICE, DISPLAY DEVICE, HAND-CARRY ELECTRONIC DEVICE, AND DISPLAY DRIVING METHOD

(75) Inventor: Akira Morita, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/536,088

(22) Filed: Mar. 24, 2000

(30) Foreign Application Priority Data

Mar. 26, 1999 (JP) .......................................... 11-084762

(51) Int. Cl.[7] .............................. G09G 5/00; H03F 3/42
(52) U.S. Cl. ........................ 345/209; 345/690; 345/94; 330/255
(58) Field of Search ................................ 345/209, 690, 345/94, 96; 330/255, 265

(56) References Cited

U.S. PATENT DOCUMENTS

| | | | | |
|---|---|---|---|---|
| 4,959,623 A | * | 9/1990 | Khoury ........................ | 330/265 |
| 5,162,753 A | * | 11/1992 | Khorramabadi ............. | 330/264 |
| 5,909,146 A | * | 6/1999 | Okada ......................... | 330/255 |
| 6,166,725 A | * | 12/2000 | Isami et al. .................. | 345/209 |

FOREIGN PATENT DOCUMENTS

| | | |
|---|---|---|
| JP | 04-107594 | 4/1992 |
| JP | 08-122733 | 5/1996 |

\* cited by examiner

Primary Examiner—Steven Saras
Assistant Examiner—William C. Spencer
(74) Attorney, Agent, or Firm—Hogan & Hartson, LLP

(57) ABSTRACT

A display drive apparatus for driving liquid crystals by applying a voltage to the liquid crystals based on gray-scale data representative of a display. The display drive apparatus includes a polarity control circuit, an input selection circuit, a non-linear operation region identifying circuit and an offset current generation circuit. The polarity control circuit generates a polarity control signal based on a polarity signal. The input selection circuit selects a predetermined reference voltage for driving the liquid crystals from a plurality of reference voltages provided from an input voltage generation circuit or a plurality of reference voltages generated within the input selection circuit based on an input signal representative of gray-scale data and the polarity control signal. The non-linear operation region identifying circuit identifies a non-linear operation region in which an output signal from an operational amplifier does not follow an input thereto based on the input signal and the polarity control signal, and outputs an offset current generation control signal for supplementing the current of the output signal of the operational amplifier when an input voltage in the non-linear operation region is subjected to an operation amplification. The operational amplifier inputs the predetermined reference voltage selected by the input selection circuit and outputs at an output terminal an output signal that is operation-amplified according to the predetermined reference voltage. The offset current generation circuit supplements the current at the output terminal of the operational amplifier based on the offset current generation control signal outputted from the non-linear operation region identifying circuit.

28 Claims, 21 Drawing Sheets

DISPLAY DRIVE DEVICE, DISPLAY DEVICE, HAND-CARRY ELECTRONIC DEVICE, AND DISPLAY DRIVING METHOD

BACKGROUND OF THE INVENTION

1. Field of the Invention

The present invention relates to display drive devices and drive methods to drive displays such as liquid crystal displays. More specifically, the present invention relates to the improvement of drive output of display drive devices.

2. Description of Related Art

FIG. 21 schematically shows a structure of a flat display 700. The flat display 700 contains a flat display 710 such as a liquid crystal panel, an X-driver 720, a Y-driver 730 and a controller 740. The X-driver reads display data equivalent to one row of the display from data line 761 based on a predetermined control signal 760 from controller 740. Based on instructions from the controller 740, the Y-driver applies row selection voltage successively to scan electrodes for the 1st to Nth rows of the display 710. In association with this operation, the X-driver outputs voltage for display data of the one row to the signal electrodes for the 1st to Mth columns of the display 710. In this way, a display corresponding to display data is realized.

Now, let us consider conventional display drive devices (e.g., X-drivers). For example, let us consider Japanese Laid-open Patent Application HEI 4-107594. This reference shows the use of operational amplifiers, as indicated by reference numerals 10 and 13 in FIG. 1 and FIG. 3 of Patent Application HEI 4-107594. However, the amplifier only uses a transistor as a differential unit that has either an N-channel or a P-channel. Consequently, this operational amplifier presents a non-linear operation region 820 near the positive power supply potential, as shown in FIG. 22 of the present patent application, in the response of the output voltage to input voltage. With such a characteristic, even when a high voltage is to be output to a signal electrode in response to data with a high gray-scale level, a sufficient voltage cannot be applied to the signal electrode. As a result, it will be difficult to obtain a gray-scale display demanded. FIG. 22 of the present application shows an operational amplifier with an N-channel transistor for the differential unit, but using a P-channel transistor would also create a similar, albeit opposite, problem, as shown in FIG. 23 of the present application.

Japanese Laid-Open Patent Application HEI 8-122733 shows a different example of a drive method of a display drive device (an X-driver) in which voltages of the same polarity are applied to adjacent signal electrodes (e.g., 711 and 712 in FIG. 21 of the present application) and voltages of the opposite polarity are applied in the next display cycle. This reference describes an amplifier A (9) that absorbs current and an amplifier B (10) that releases current. A switch SA (11) and a switch SB (12) are opened or closed to selectively use the amplifier A (9) or the amplifier B (10) according to the voltage to be applied to CL. Since this structure entails discrete switching between the two types of amplifiers whose circuits are separate from one another, the following problem occurs. Namely, the open/close control between the switch SA (11) and the switch SB (12) would ideally be conducted such that one of them turns on while the other turns off, and such switching should take place simultaneously. However, strictly speaking, the possibility that there would be a moment when both of the switches are on or both of the switches are off cannot be denied. In such cases, there would be a problem of an output short-circuit or an output open-circuit. Further, even when the open/close control is to take place successfully, since the two amplifiers with individual differences are combined, a non-linear operation part 890 is created, as shown in FIG. 24 of the present application, resulting in display unevenness and display fluctuations.

In addition, although not shown in the figures, in a prior art circuit where an input voltage to an operational amplifier is selected, there is a possibility that a power supply voltage would be applied to individual transistors. Accordingly, transistors with a dielectric strength enough to withstand the power supply voltage have to be used. As a result, a large circuit area is required.

Furthermore, when using an operational amplifier with either a P-channel or an N-channel differential unit for one output, and forming a positive or a negative output by the differential output and a current source that operates by capacitive coupling with the differential output, the area required by a capacitor for the capacitive coupling has to be several times the area of the output transistor area, which consequently requires a large circuit area.

In a one-channel operational amplifier (900) in FIG. 25 of the present application, where an output is formed by a differential output (912) and a current source (930) operating with a capacitive coupling (920), the linear operation region of the output tends to become narrower. Consequently, either the power supply voltage Vdd has to be raised or the transistor's threshold voltage has to be lowered. Additionally, because it requires a constant-current source (930) for the output, it was necessary to constantly supply a current to the output, which requires a large amount of current.

Therefore, the display device driving in the conventional technique has the following problems.

Namely, a proper voltage, that matches the gray-scale data, cannot be applied to liquid crystals in a non-linear operation region of the operational amplifier. As a result, a required gray-scale presentation cannot be obtained.

In a driving technique to cover a non-linear operation region by a pair of operational amplifiers having different polarities, problems, such as an output short circuit and an output open circuit, can occur.

In addition, when the operational amplifiers in the combination are switched from one to the other, a non-linear section appears in an output due to potential mismatching between the potentials at their junction, as shown in FIG. 24. As a result, a smooth gray-scale transition cannot be obtained, resulting in problems such as display non-uniformity and display fluctuation.

Also, transistors with a dielectric strength greater than the power supply voltage have to be used. As a result, a large circuit area is required. A circuit that requires a greater capacity also requires a greater circuit area. Also, in a circuit that requires a constant-current source (930), a large amount of current is consumed.

SUMMARY OF THE INVENTION

In accordance with one embodiment of the present invention, a display drive apparatus is provided for driving liquid crystals by applying a voltage to the liquid crystals based on gray-scale data representative of a display. The display drive apparatus includes a polarity control circuit that generates a polarity control signal based on a polarity signal; an input selection circuit that selects a predetermined reference voltage for driving the liquid crystals from a plurality of reference voltages provided from an input voltage generation circuit or a plurality of reference voltages generated within the input selection circuit based on an input signal representative of gray-scale data and the polarity control signal; a non-linear operation region identifying circuit that identifies a non-linear operation region in which an output signal from an operational amplifier does not follow an input thereto based on the input signal and the polarity control signal, and outputs an offset current generation control signal for supplementing the current of the output signal of the operational amplifier when an input voltage in the non-linear operation region is subjected to an operation amplification, wherein the operational amplifier inputs the preferred reference voltage selected by the input selection circuit and outputs at an output terminal an output signal that is operation-amplified according to the preferred reference voltage; and an offset current generation circuit that supplements the current at the output terminal of the operational amplifier based on the offset current generation control signal outputted from the nonlinear operation region identifying circuit.

As a result, a voltage in a non-linear operation region can be supplemented with a supplemental current that is provided by the offset current generation circuit, and a supplemented voltage is provided to an output terminal. Consequently, the linearity along the entire range between the low voltage side and the high voltage side can be secured, to thereby correctly apply a voltage that matches gray-scale data. Also, unlike the conventional technique, a large amount of current does not have to be constantly supplied. Furthermore, an operational amplifier provides an accurate output because output deviations due to performance deviations in transistors in the operational amplifier are mutually offset. In addition, the size of a differential unit can be reduced. Also, unlike the conventional technique in which the control of the operation amplifier is discrete, the present invention provides a continuous control over the operational amplifier, resulting in a higher operation speed.

In the display drive apparatus described above, the non-linear operation region identifying circuit outputs an offset current generation control signal in such a manner that the amount of the offset current is varied depending on the degree of deviation from a linearity of an input/output characteristic of the operational amplifier.

As a result, the operational amplifier provides an output closer to a linear characteristic in its non-linear region.

In the display drive apparatus described above, the non-linear operation region identifying circuit determines the offset current generation control signal based on the value of an input signal of gray-scale data.

As a result, the amount of the offset current can be corrected based on the data in advance, resulting in a linearity correction with a good response.

In the display drive apparatus described above, the non-linear operation region identifying circuit determines the offset current generation control signal based on predetermined upper bits of the input signal of gray-scale data.

Since the amount of offset current to be generated is determined by digital data, a relatively simple circuit structure can be implemented.

In the display drive apparatus described above, the non-linear operation region identifying circuit performs a conduction control for a transistor (423, 433) such that the offset voltage is selected when the polarity control signal has a predetermined value, and performs a conduction control for another transistor (426, 436) such that a power supply voltage having a polarity with which the offset current generation circuit does not conduct current is selected when the polarity control signal has a value having an opposite polarity with respect to that of the predetermined value.

As a result, problems such as output open circuit or output short circuit do not occur.

In the display drive apparatus described above, the polarity control circuit generates polarity control signals including a polarity control signal for even-numbered columns of the display and a polarity control signal for odd-numbered columns of the display.

The polarity control signals for the even-numbers columns and the odd-numbered columns can be provided to drive a liquid crystal display according to the dot-inversion control system.

In the display drive apparatus described above, the polarity control circuit generates a polarity control signal for even-numbered columns of the display and a polarity control signal for odd-numbered columns of the display that are mutually in logically inverted relation, depending on a logic level of the polarity signal, and further comprises a voltage changing circuit.

As a result, a polarity control signal can be transferred to a succeeding stage as a signal with a different electric signal level.

In the display drive apparatus described above, the operational amplifier has a first differential unit and a second differential unit having transistors with mutually opposite polarities. The offset current generation circuit and the second differential unit perform an amplification operation when an input to the operational amplifier is in a non-linear operation region of the first differential unit. The offset current generation circuit and the first differential unit perform an amplification operation when an input signal is in a non-linear operation region of the second differential unit. The first differential unit and the second differential unit perform an amplification operation in which the first differential unit and the second differential unit mutually supplement one another to provide an output when the first differential unit and the second differential unit are both in a linear operation region.

As a result, even when operational amplifiers have characteristic variations, they are mutually supplemented, and a linear characteristic can be obtained as a whole.

In the display drive apparatus described above, the offset current generation circuit is provided within the operational amplifier.

Since the offset current generation circuit is provided very close to an output terminal in which an offset current is supplied, the wire routing is simplified and the wiring impedance can be reduced.

In the display drive apparatus described above, the operational amplifier has a differential unit including a P-channel transistor and a differential unit having an N-channel transistor. The non-linear operation region identifying circuit and the offset current generation circuit provide an offset current to supply an electric charge to an output terminal of the operational amplifier when an output to be provided from the operational amplifier is at a low potential side, and provides an offset current to pull an electric charge from the output terminal when an output to be provided from the operational amplifier is at a high potential side.

As a result, an offset current does not always have to be supplied, and an intended object is achieved by supplying a minimum offset current.

The display drive apparatus described above is a semiconductor integrated circuit.

As a result, the display drive apparatus can be reduced in size, and can be readily mounted in a display apparatus.

The present invention includes a display apparatus equipped with the display drive apparatus and a liquid crystal display and a hand-carry type electronic apparatus equipped with the display apparatus.

The present invention can meet the requirements of display apparatuses and hand-carry type electronic apparatuses, such as small sized circuits, lower current consumption, less display unevenness and fewer display fluctuations.

Furthermore, in a display drive apparatus for driving liquid crystals by applying a voltage to the liquid crystals based on gray-scale data of a display, the apparatus includes a polarity control circuit that generates a polarity control signal based on a polarity signal; an input selection circuit that selects a predetermined reference voltage for driving the liquid crystals from a plurality of reference voltages provided from an input voltage generation circuit or a plurality of reference voltages generated within the input selection circuit based on an input signal representative of gray-scale data and the polarity control sinal; a non-linear operation region identifying circuit that inputs the predetermined reference voltage selected by the input selection circuit and identifies a non-linear operation region in which an output signal from an operational amplifier does not follow an input thereto based on the selected predetermined reference voltage, and outputs an offset current generation control signal for supplementing the current of the output signal of the operational amplifier when an input voltage in the non-linear operation region is subjected to an operation amplification, wherein the operational amplifier inputs the predetermined reference voltage selected by the input selection circuit and outputs at an output terminal an output signal that is operation-amplified according to the predetermined reference voltage; and an offset current generation circuit that supplements the current at the output terminal of the operational amplifier based on the offset current generation control signal outputted from the non-linear operation region identifying circuit.

As a result, the non-linear operation region identifying circuit directly inputs a voltage inputted in the operational amplifier and identifies the non-linear operation region. Accordingly, a more accurate linear correction can be achieved.

In addition, a display driving method for driving a display including selecting a reference voltage based on a gray-scale data, operation-amplifying the reference voltage to obtain a gray-scale for the display, changing voltages to be applied to liquid crystals based on the gray scale data to perform a driving operation, identifying a non-linear operation region in which an output signal from an operational amplifier does not follow an input thereto based on an input signal and a polarity control signal, outputting an offset current generation control signal for supplementing the current of the output signal of the operational amplifier when an input voltage in the non-linear operation region is subjected to an operation amplification, and supplementing an output signal from the operational amplifier with an offset current based on the offset current generation control signal when an input to the operational amplifier is at a low potential side or a high potential side.

Other features and advantages of the invention will be apparent from the following detailed description, taken in conjunction with the accompanying drawings which illustrate, by way of example, various features of embodiments of the invention.

DETAILED DESCRIPTION OF THE INVENTION

Figure 4:
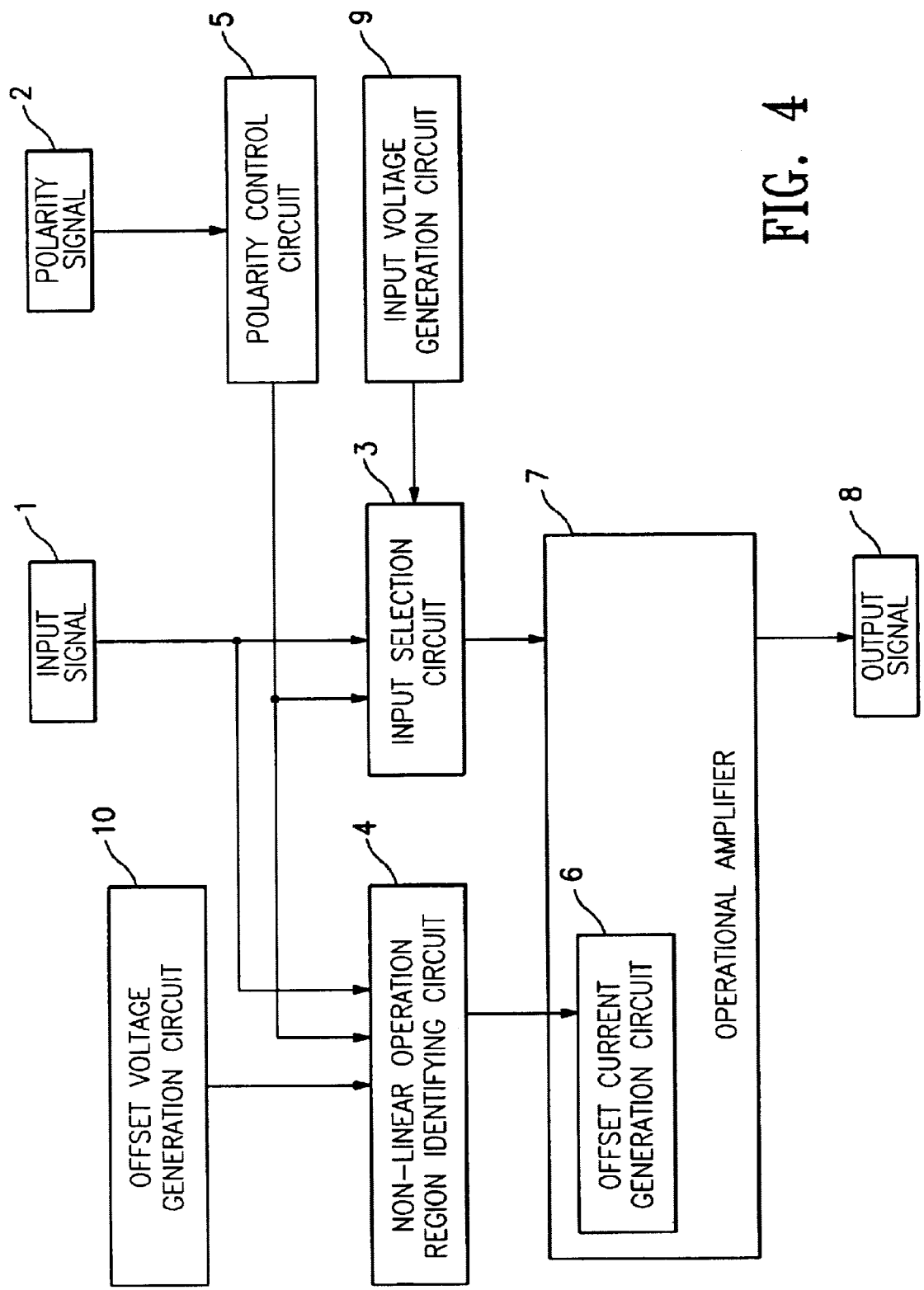
FIG. 4 shows a block diagram of a display drive device in accordance with a preferred first embodiment of the present invention.

Display drive devices according to the present invention are to be used primarily as drive devices to drive and display liquid crystal displays and, more particularly, as active matrix liquid crystal displays such as TFT liquid crystal panels. A display drive device according to one embodiment is shown in FIG. 4. In FIG. 4, the display drive device contains a polarity control circuit 5, an input voltage generation circuit 9, an input selection circuit 3, a non-linear operation region identifying circuit 4, an offset voltage generation circuit 10 and an operational amplifier 7.

The display drive device processes an input signal 1 and a polarity signal 2, and outputs an output signal 8.

Figure 21:
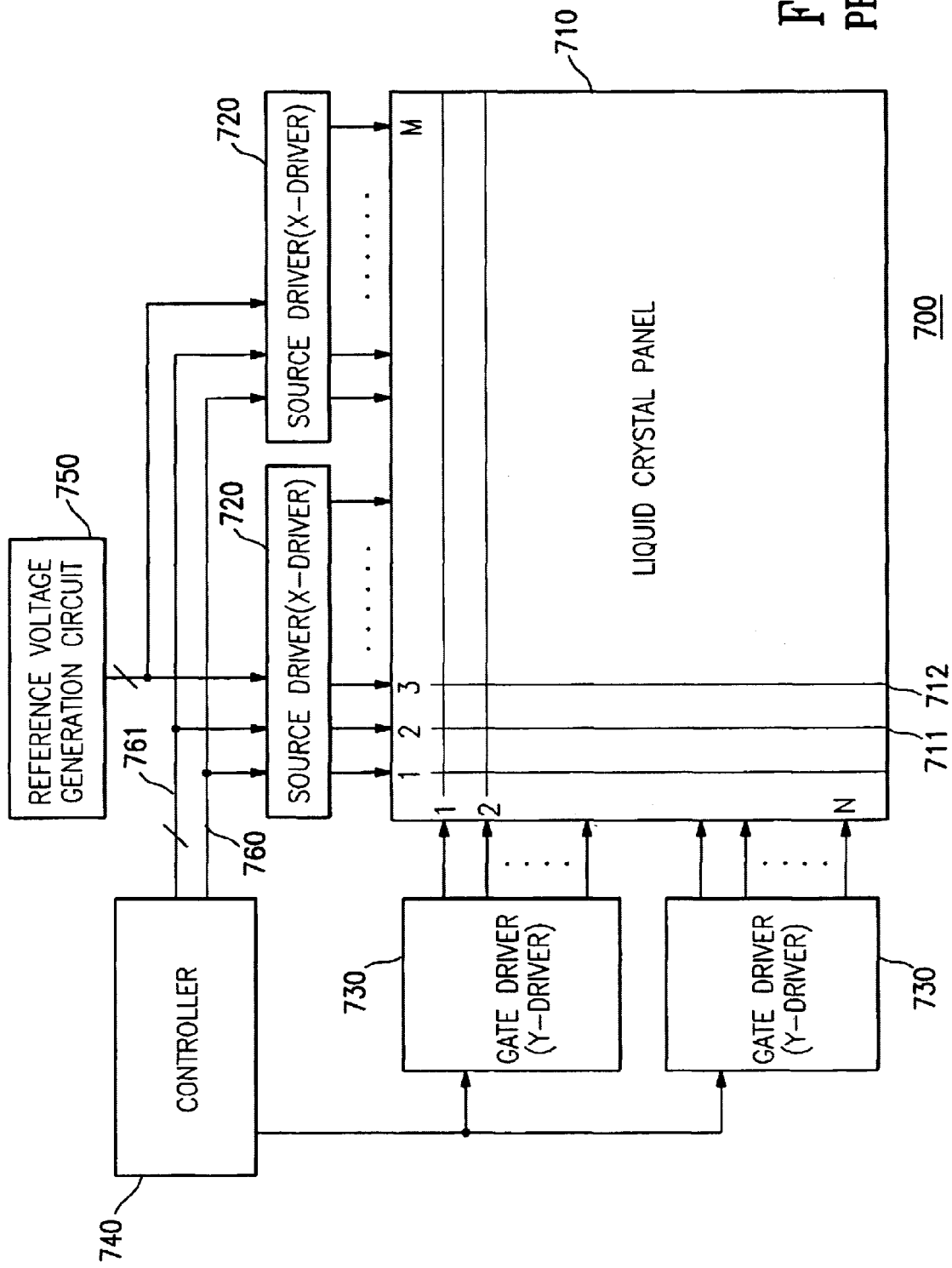
FIG. 21 schematically shows a structure of a flat display.

The input signal 1 is a signal that represents the display gray-scale value of each pixel on the display. The input signal is normally a data signal comprising a plurality of bits. The source of the input signal 1 is a controller 740, as shown in FIG. 21, and is inputted in accordance with a predetermined control signal timing.

The polarity signal 2 represents whether the voltage outputted to a signal electrode is positive or negative polarity with respect to the center voltage (not shown in the figures). Liquid crystals must have an alternating current drive. A line inversion control method and a dot inversion control drive method are known as the alternating current drive methods. Let us consider the voltage that is outputted to signal electrodes of adjacent columns. Voltages of the same polarity are applied to both of the signal electrodes of the adjacent columns when a liquid crystal display is driven under the line inversion control method. On the other hand, a positive voltage and a negative voltage are applied to signal electrodes of adjacent columns when driven under the dot inversion control method. Consequently, when driven under the dot inversion control method, the voltage polarity must be controlled so that the even-numbered columns and odd-numbered columns have opposite polarities to each other. In such a situation, it would be convenient to separately create positive/negative polarity signals to be sent to even-numbered columns and corresponding negative/positive polarity signals to be sent to odd-numbered columns based on polarity signals.

The output signal 8 is provided to signal electrodes of a display such as a liquid crystal panel and thereby drives the liquid crystals.

Figure 9:
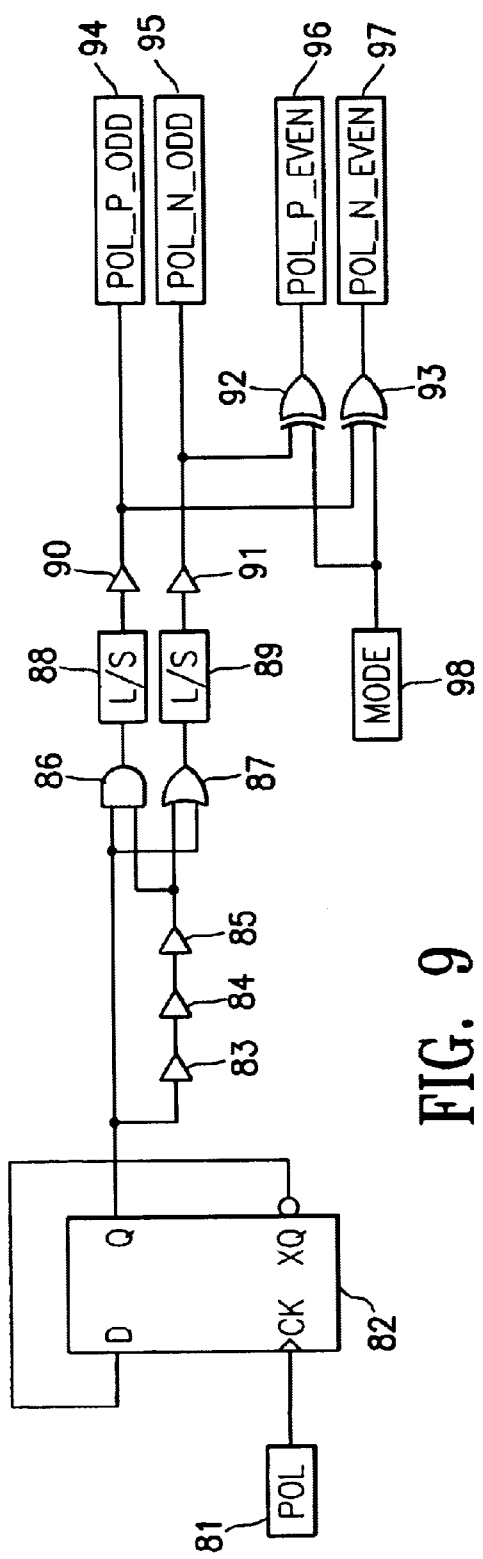
FIG. 9 shows a first example embodiment of a polarity control circuit in accordance with the present invention.
Figure 10:
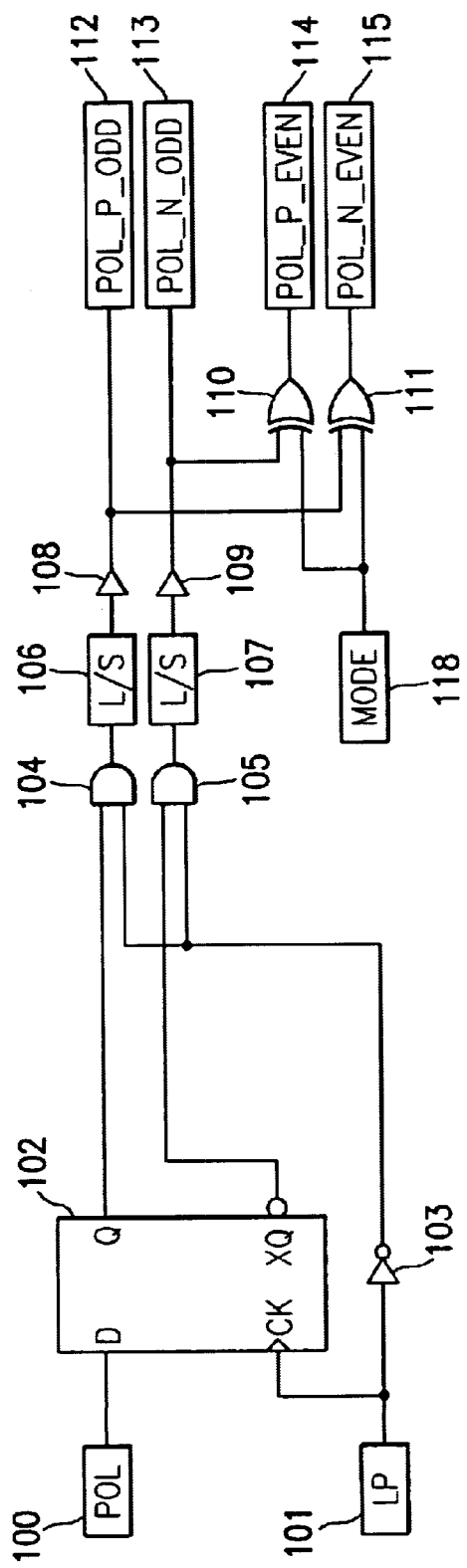
FIG. 10 shows a second example embodiment of a polarity control circuit in accordance with the present invention.

The polarity control circuit 5 is a circuit that generates signals for polarity control based on polarity signal 2. For example, such circuits are shown in FIGS. 9 and 10. In the example embodiments, polarity control signals for even-numbered columns (96, 97, 114, 115) or polarity control signals for odd-numbered columns (94, 95, 112, 113) are generated according to the logic level of polarity signal POL (81, 100). Any circuits including those shown in FIG. 9 or FIG. 10 may be used, but a circuit shown in FIG. 10 may preferably be used. This is because this circuit allows polarity control based also upon relationships with timing signal LP (101).

The input voltage generation circuit 9 is a circuit that generates a plurality of reference voltages to drive the liquid crystal display. The input voltage generation circuit 9 outputs a plurality of reference voltages, each having a different value, such as V0, V1, V2, V 3, V4, V5, V6 and V7. Here, potentials obtained by dividing the potential between the power supply potential and the ground with resistors may be used as the reference voltages. Also, a reference voltage temperature-corrected with the temperature coefficient of liquid crystals to be driven may be created and outputted. A function to alter the output voltage at the user's instruction to adjust contrast may be included in the input voltage generation circuit 9.

Figure 12:
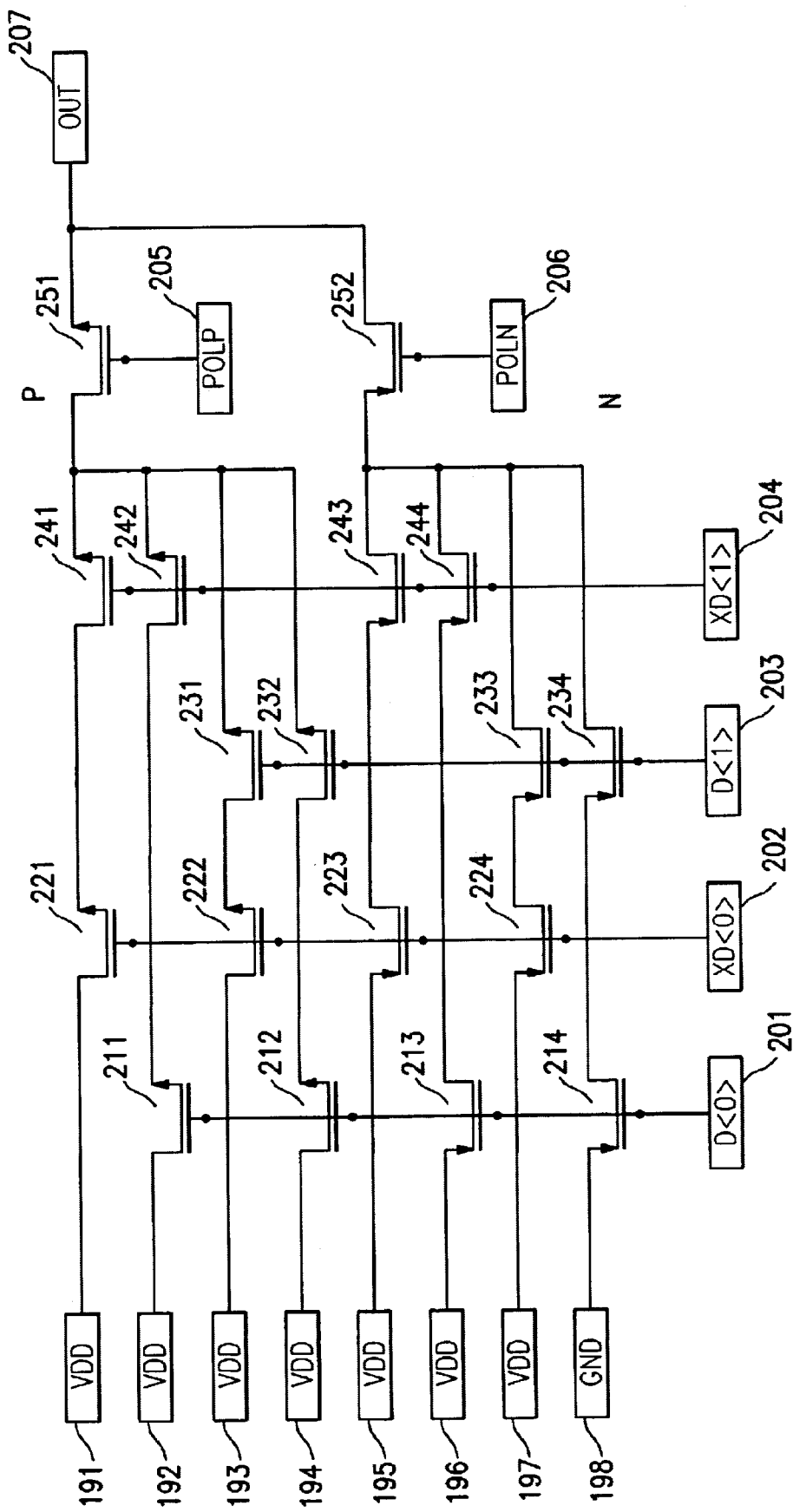
FIG. 12 shows a second example embodiment of an input selection circuit in accordance with the present invention.
Figure 14:
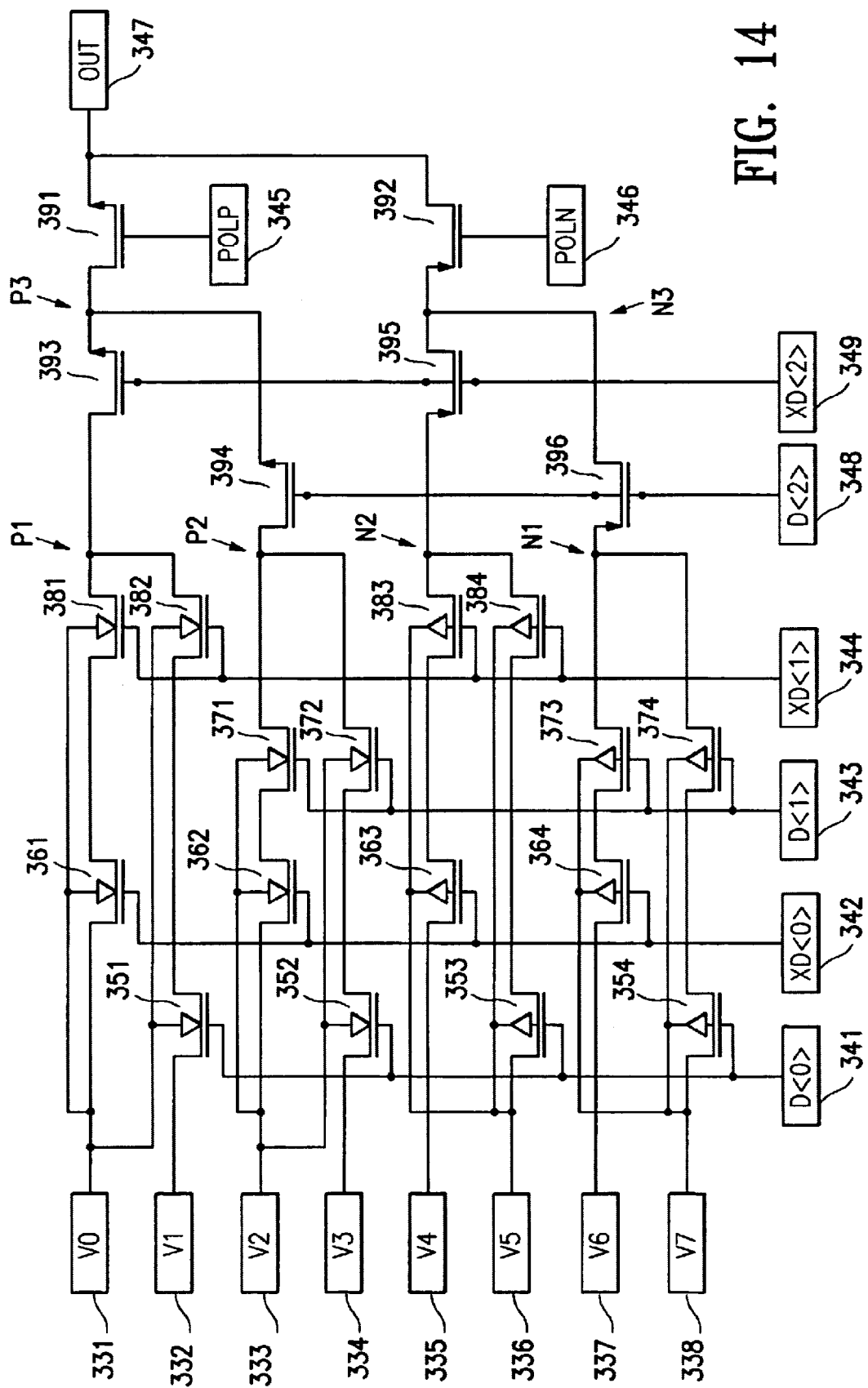
FIG. 14 shows a fourth example embodiment of an input selection circuit in accordance with the present invention.

The input selection circuit 3 is a circuit that selects, based on an input signal and a polarity control signal, a predetermined reference voltage for driving the liquid crystal from among either the plurality of reference voltages supplied by the input voltage generation circuit 2 or the plurality of reference voltages created within the input selection circuit. For example, such circuits are shown in FIGS. 12 and 14. In the figures, input signals D<0>, D<1>, XD<0>, XD<1> are inputted and decoding takes place based on the input signals to select one reference voltage from among V0 through V7. This circuit also selects an output signal whose polarity is in accordance with a polarity control signal POLP or POLN. Any one of the circuits including those shown in FIG. 12 or FIG. 14 may be used. However, a circuit shown in FIG. 12 may preferably be used. This is because the circuit in FIG. 12 allows a fewer number of well divisions compared to the circuit shown in FIG. 14, and consequently allows a smaller chip area and therefore lower cost.

The offset voltage generation circuit 10 is the source of voltage for offset current control and outputs a plurality of voltages with different values. The offset voltage generation circuit 10 may derive its outputs potentials by dividing the potential between the power supply potential and the ground with resistors. Also, a voltage that is temperature-corrected with the temperature coefficient of liquid crystals to be driven may be outputted.

Figure 22:
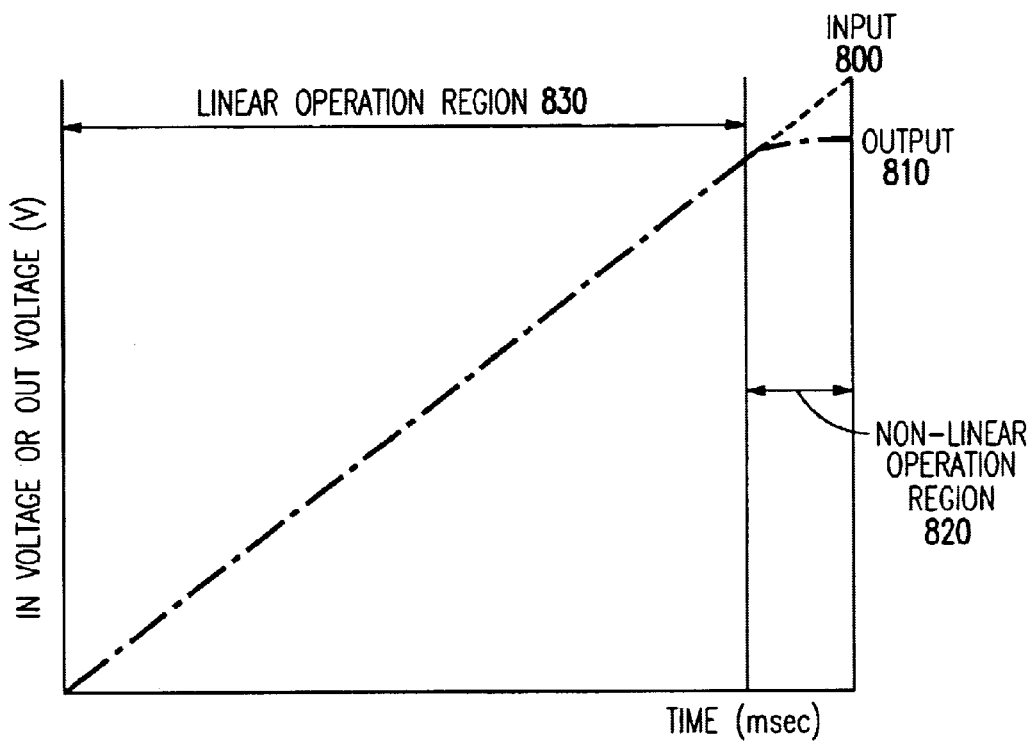
FIG. 22 is a graph showing an input/output characteristic of an operational amplifier.
Figure 23:
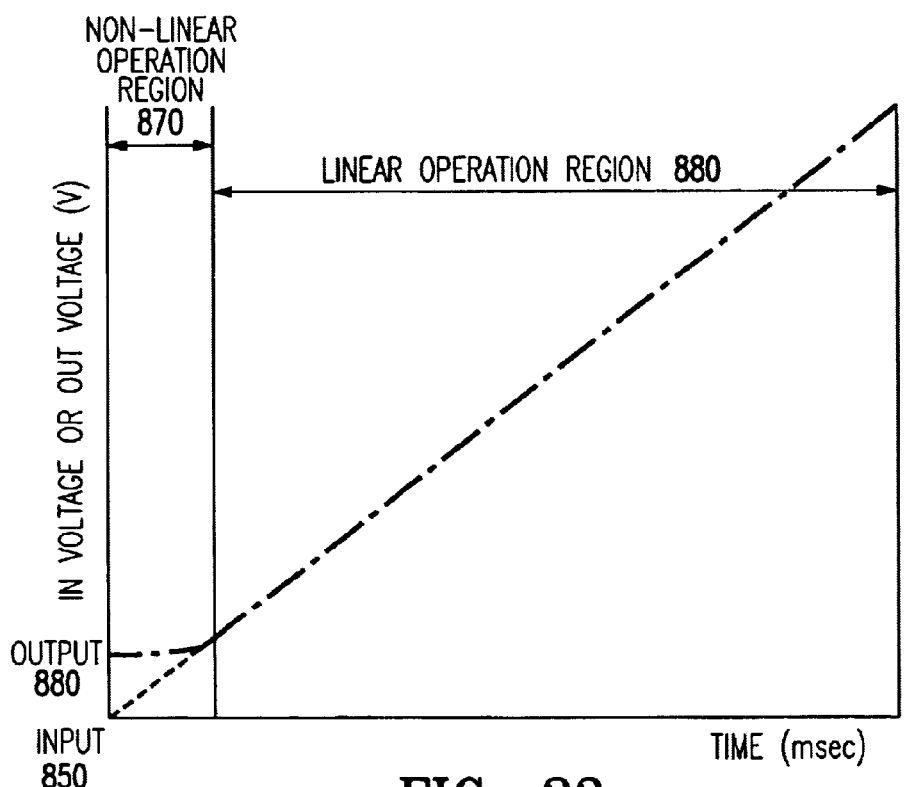
FIG. 23 is a graph showing an input/output characteristic of an operational amplifier.
Figure 24:
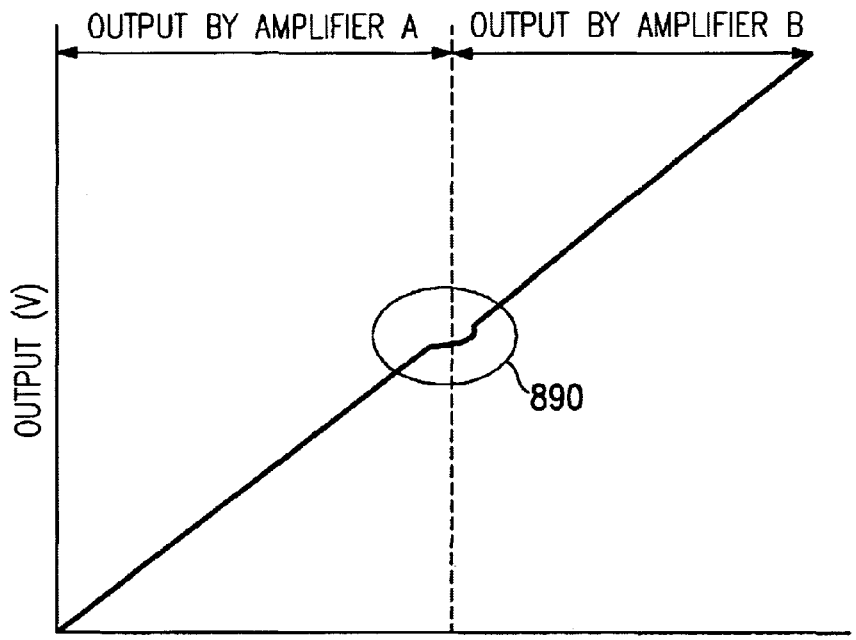
FIG. 24 is a graph showing an output characteristic of an operational amplifier having two amplifiers that are switched with one another to provide the linearity.
Figure 25:
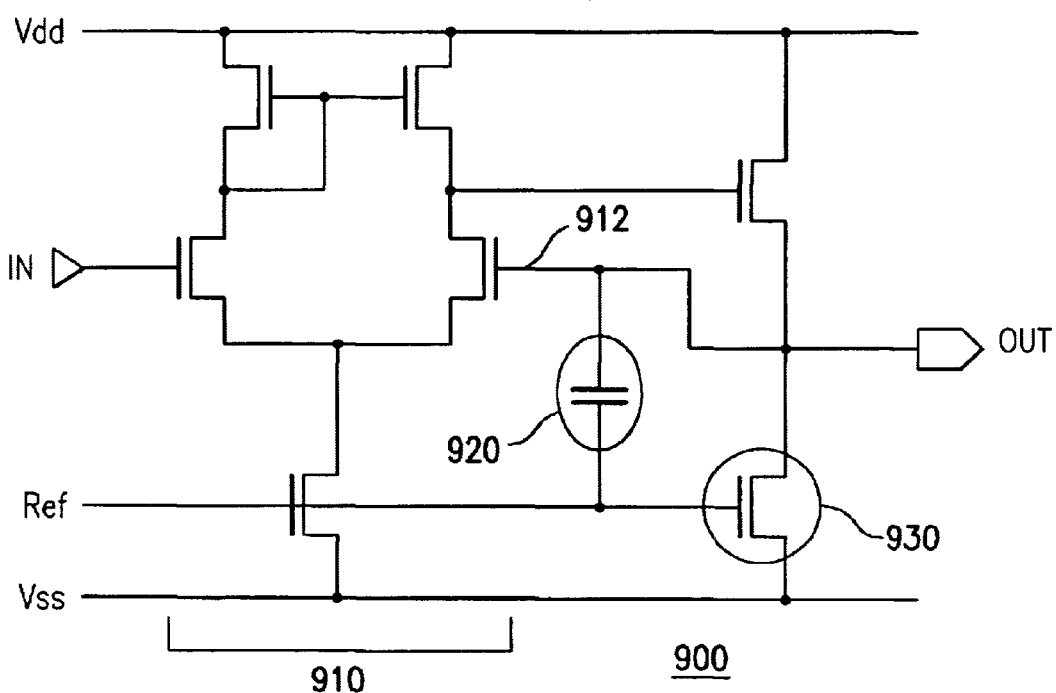
FIG. 25 shows a schematic circuit diagram of a one-channel operational amplifier.

The non-linear operation region identifying circuit 4 operates in accordance with the characteristics of the output voltage against those of the input voltage of an operational amplifier used in a succeeding stage. In other words, the non-linear operation region identifying circuit 4 identifies, based on the input/output characteristic, when a voltage for the non-linear operation region, such as near 0V and 10V in FIG. 19, region 820 in FIG. 22 and region 870 in FIG. 23, is to be outputted and when a voltage for the linear operation region is to be outputted. In situations where the voltage for the non-linear operation region should be outputted, the non-linear operation region identifying circuit 4 outputs a signal to compensate for the current amount of the output signal in response to the degree of deviation from the linearity shown in FIGS. 19, 22 and 23.

Figure 15:
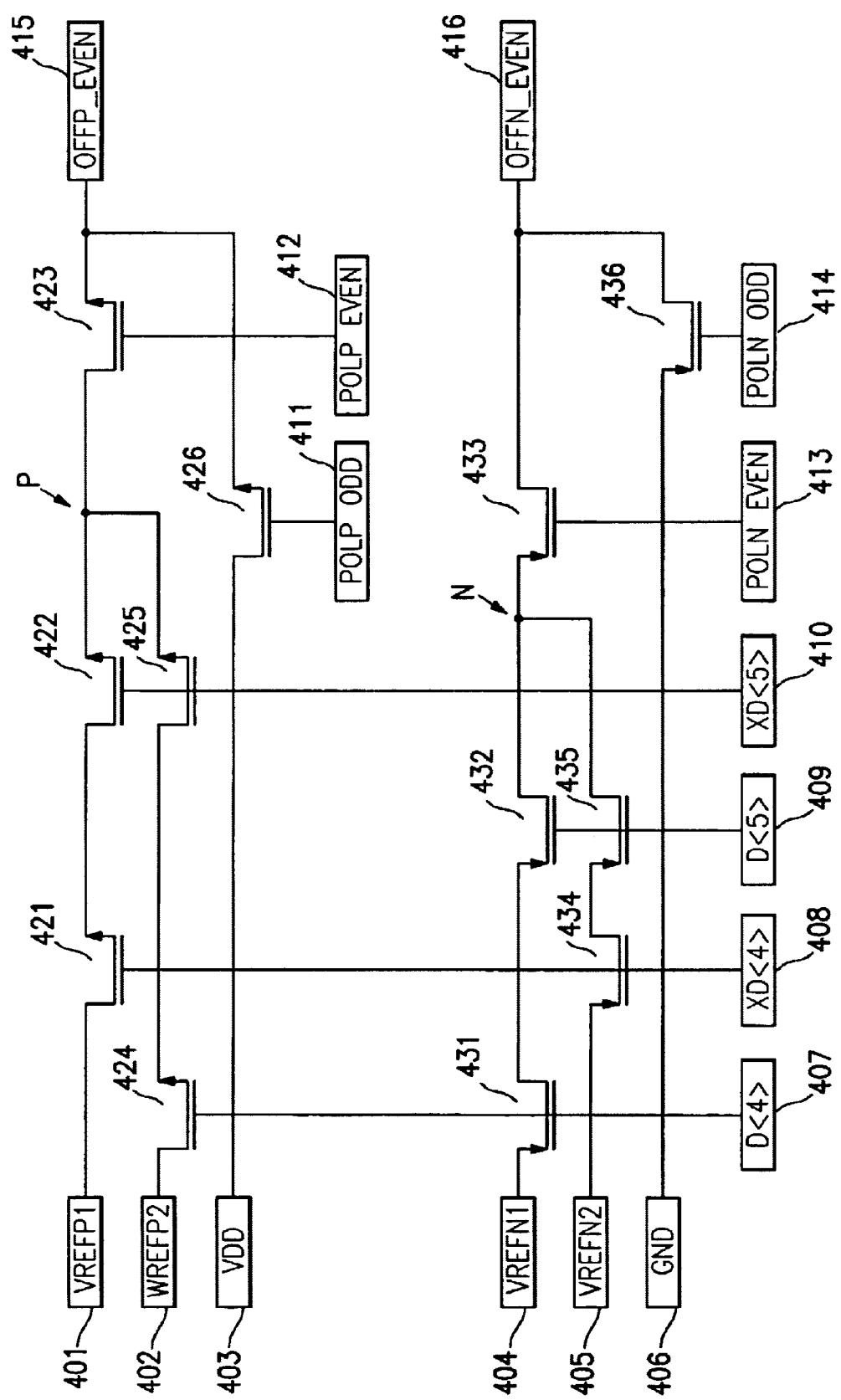
FIG. 15 shows a first example embodiment of a non-linear operation region identifying circuit in accordance with the present invention.
Figure 16:
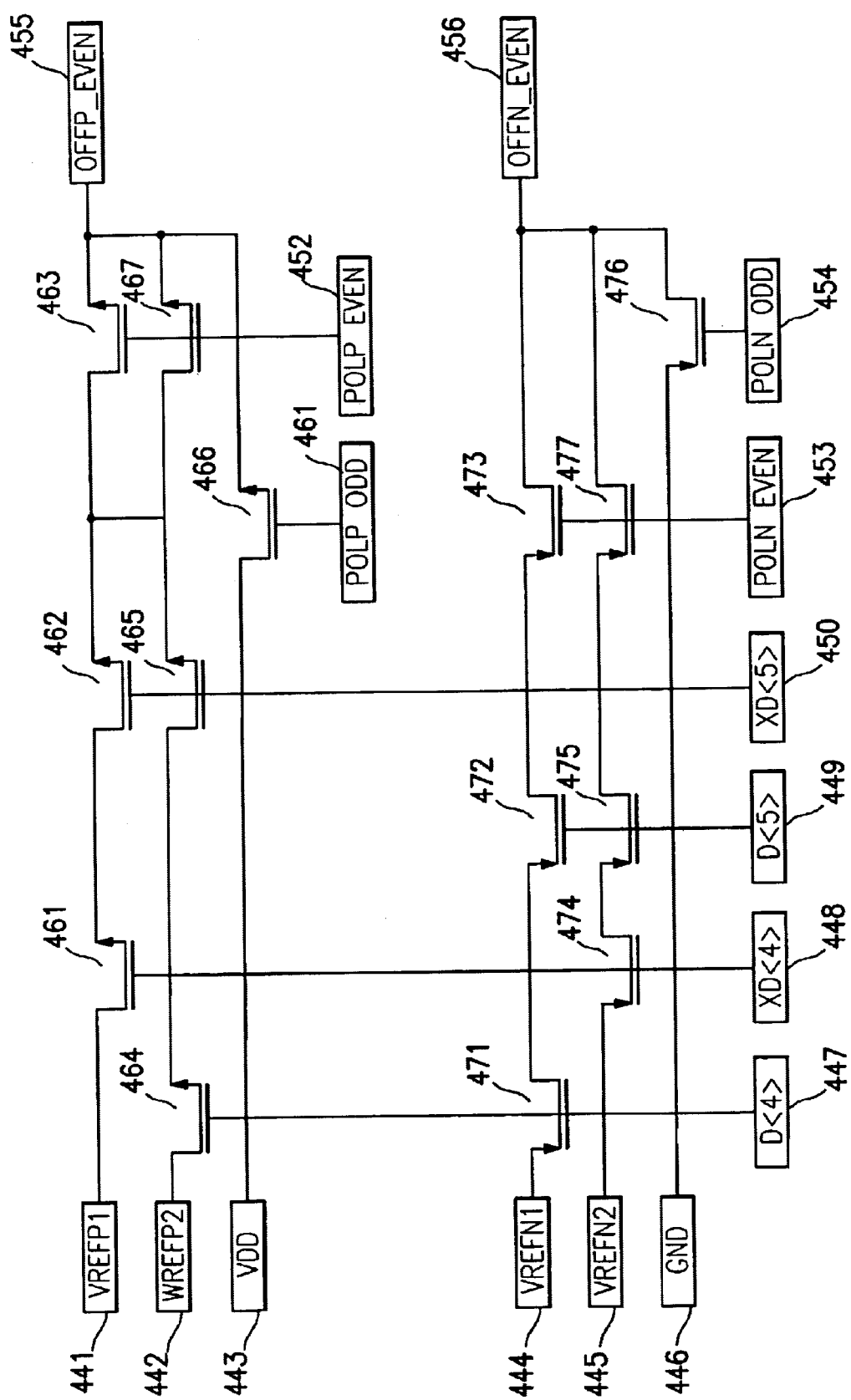
FIG. 16 shows a second example embodiment of a non-linear operation region identifying circuit in accordance with the present invention.

The non-linear operation region identifying circuit 4 may be selected from any one of the circuits including those shown in FIG. 15 or FIG. 16, but a circuit in accordance with a preferred embodiment is shown in FIG. 15. FIG. 15 shows a non-linear operation region identifying circuit 4 only for the even-numbered columns. According to the circuit shown in FIG. 15, a decoding circuit comprising transistors 421, 422, 424 and 425 and a connection control transistor 423 for current supplementation can be independent from each other in the circuit design, which is an advantage that allows design changes to the decoding circuit unit without causing any impact on the transistor 423 that performs connection control. This also applies to the relationship between transistors 431, 432, 434, 435 and the transistor 433.

Figure 18:
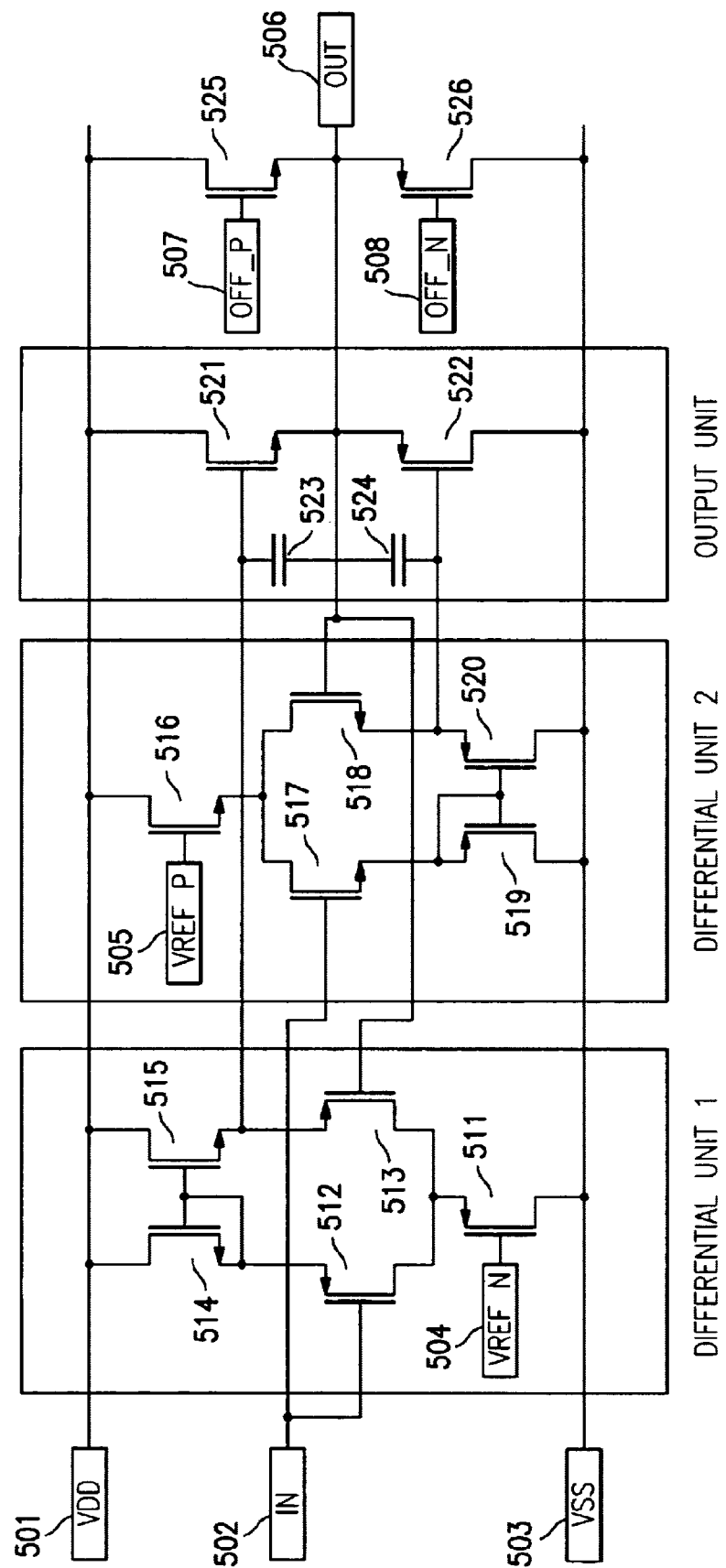
FIG. 18 shows an operational amplifier and an offset current generation circuit in the operational amplifier in accordance with an embodiment of the present invention.

The operational amplifier 7 contains an operational amplifier main body and an offset current generation circuit 6. An embodiment of the operational amplifier 7 is shown in FIG. 18. The operational amplifier 7 contains the offset current generation circuit 6 and the operational amplifier main body, which consists of a differential unit 1, a differential unit 2 and an output unit. The operational amplifier 7 inputs the potential outputted from the input selection circuit 3 at an input terminal 502, and in response performs operational amplification and provides an output signal 8 to an output terminal 506. When the output signal 8 enters a non-linear operation region where the output potential does not follow the input potential, the operational amplifier 7 generates a supplemental current to the output terminal 506 from the offset current generation circuit 6, so that the output would follow the input even in the non-linear operation region.

Let us now explain in more detail the operational characteristics of the operational amplifier 7. In the differential unit 1, as the potential of the input terminal 502 approaches the potential of a power supply terminal VDD 501, the potential of the output terminal OUT 506 also approaches the potential of a power supply terminal VDD 501.

When this happens, the source potential of a transistor 513 also approaches the potential of the power supply terminal VDD 501. Accordingly, the gate potential of a transistor 521 cannot fall below the source potential of the transistor 513, and the transistor 521 goes into a constant off state. As a result, the output terminal OUT 506 does not rise above a certain potential.

Also, in the differential unit 2, as the potential of input terminal IN 502 approaches the potential of a negative power supply terminal VSS 503, the output terminal OUT 506 also approaches the potential of the terminal VSS 503.

When this happens, the source potential of a transistor 518 also approaches the potential of the terminal VSS 503. Accordingly, the gate potential of a transistor 522 cannot rise above the source potential of the transistor 518, and the transistor 522 goes into a constant off state. As a result, the output terminal OUT 506 does not fall below a certain potential.

Figure 19:
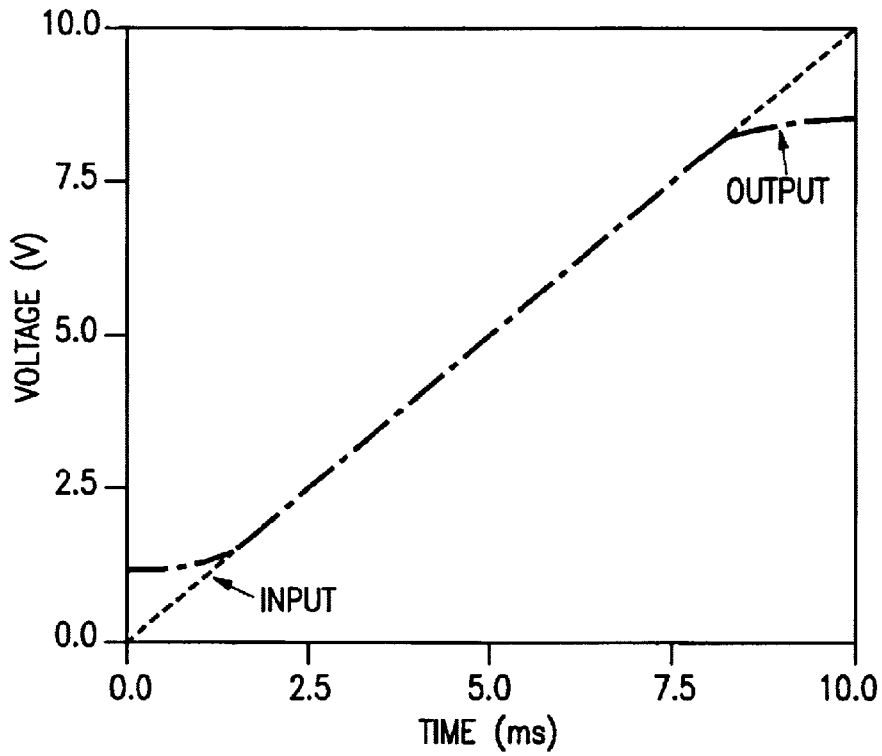
FIG. 19 shows a graph presenting an input/output characteristic of an operational amplifier when an offset current generation circuit does not function.

Let us assume that in the operational amplifier shown in FIG. 18, a potential on the power supply terminal VDD 501 is 10V, a potential on the negative power supply terminal VSS 503 is 0V, a terminal OFF_P 507 is fixed at a potential that is the same as the potential of the power supply terminal VDD 501, and a terminal OFF_N 508 is fixed at a potential same as the potential of the terminal VSS 503. In other words, let us assume that there is no offset current generation circuit or that it is not functioning. FIG. 19 shows how the output terminal 506 follows when the input voltage is experimentally sweep-changed from 0V to 10V between time 0 ms and 10 ms in such an operational amplifier. As shown in FIG. 19, the output does not follow the change in the vicinity of 0V and 10V.

Figure 20:
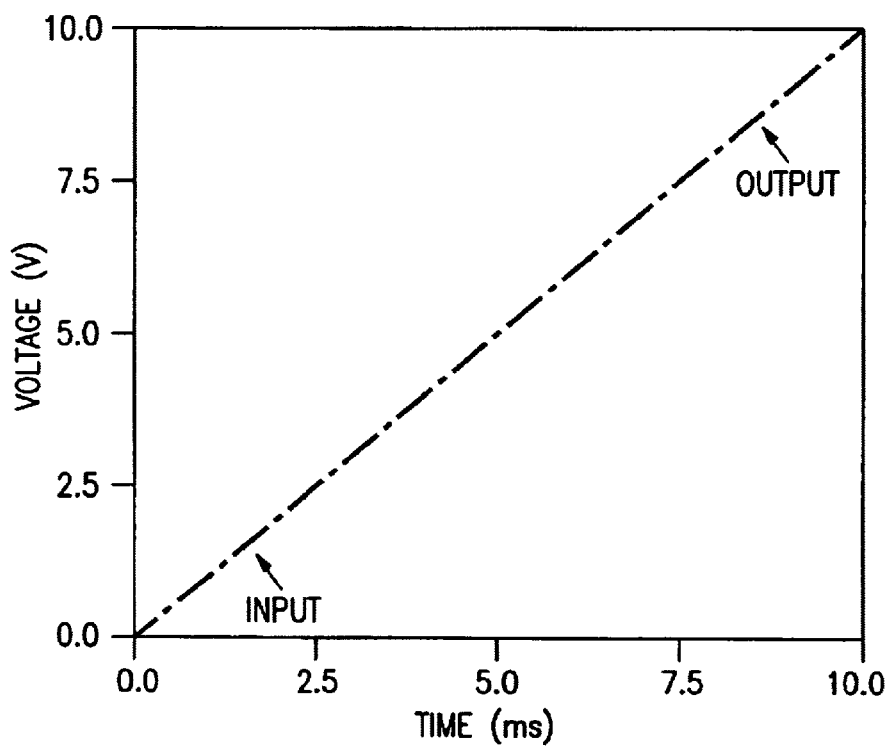
FIG. 20 shows a graph presenting an input/output characteristic of an operational amplifier when an offset current generation circuit is functioning.

On the other hand, let us consider what would happen when the offset current generation circuit is effective. In other words, when the non-linear operation region identifying circuit is working, the terminal OFF_P 507 and the terminal OFF_N 508 are controlled in the non-linear operation region where the operational amplifier does not follow, current is conducted to transistors 521 and 522, and supplemental current is conducted to the output terminal. FIG. 20 shows the responsiveness characteristics of the output against the input in this situation. In contrast to the characteristics shown in FIG. 19, the output follows the input and proportionally changes with the input even in the vicinity of 0V and 10V.

The operation performed by the best embodiment shown in FIG. 4 is summarized as follows. The polarity control circuit 5 generates a polarity control signal in response to the polarity signal 2. The input selection circuit inputs the polarity control signal, the input signal, and a plurality of reference voltages which are outputted from the input voltage generation circuit 9, selects one of the reference voltages based upon these signals, and outputs the same to the operational amplifier. In the meantime, the non-linear operation region identifying circuit 4 inputs a plurality of voltages from the offset voltage generation circuit 10 while identifying the non-linear operation region based upon the polarity control signal from the polarity control circuit 5 and the input signal 1, and determines whether an offset current to compensate for the output signal current is required. When such an offset current is required, a control signal to that effect is outputted to the offset current generation circuit 6 within the operational amplifier 7.

The operational amplifier 7 amplifies voltage and current based upon the output voltage provided by the input selection circuit 3 and the supplemental current generated by the offset current generation circuit 6 in response to the control signals, and thereby generates an output signal 8, which is previously a non-linear voltage but is now corrected as a linear voltage.

Thus, non-linear operation regions in the operational amplifier 7 in which the output would not follow the input can be eliminated. Further, in normal situations such as the linear operation regions, the input terminal 502 and the output terminal 506 of the operational amplifier in FIG. 18 are assumed to have generally the same potential. This allows the reduction or elimination of the current conducted to the transistors 521 and 522, which eliminates the need to constantly apply a large amount of current as required in prior art.

Furthermore, since the operational amplifier 7 uses a differential unit having a differential pair formed from an N-channel transistor in the differential unit 1 and a P-channel transistor in the differential unit 2, the output fluctuations caused by the fluctuations in transistor performance are mutually corrected by the current flowing through the transistors 521 and 522, with the result that the output fluctuations of the operational amplifier can be reduced.

Furthermore, the differential unit can be made smaller in size through the improved accuracy.

Moreover, because the output can follow the input within the power supply voltage range, there is no need to use a switch to change between the operational amplifier outputs as required in prior art. Unlike the prior art, in which switching operations are discrete, the continuous control in accordance with the present invention makes high-speed operation possible. And there is no need to lower the threshold voltage of the transistor as in prior art.

Figure 1:
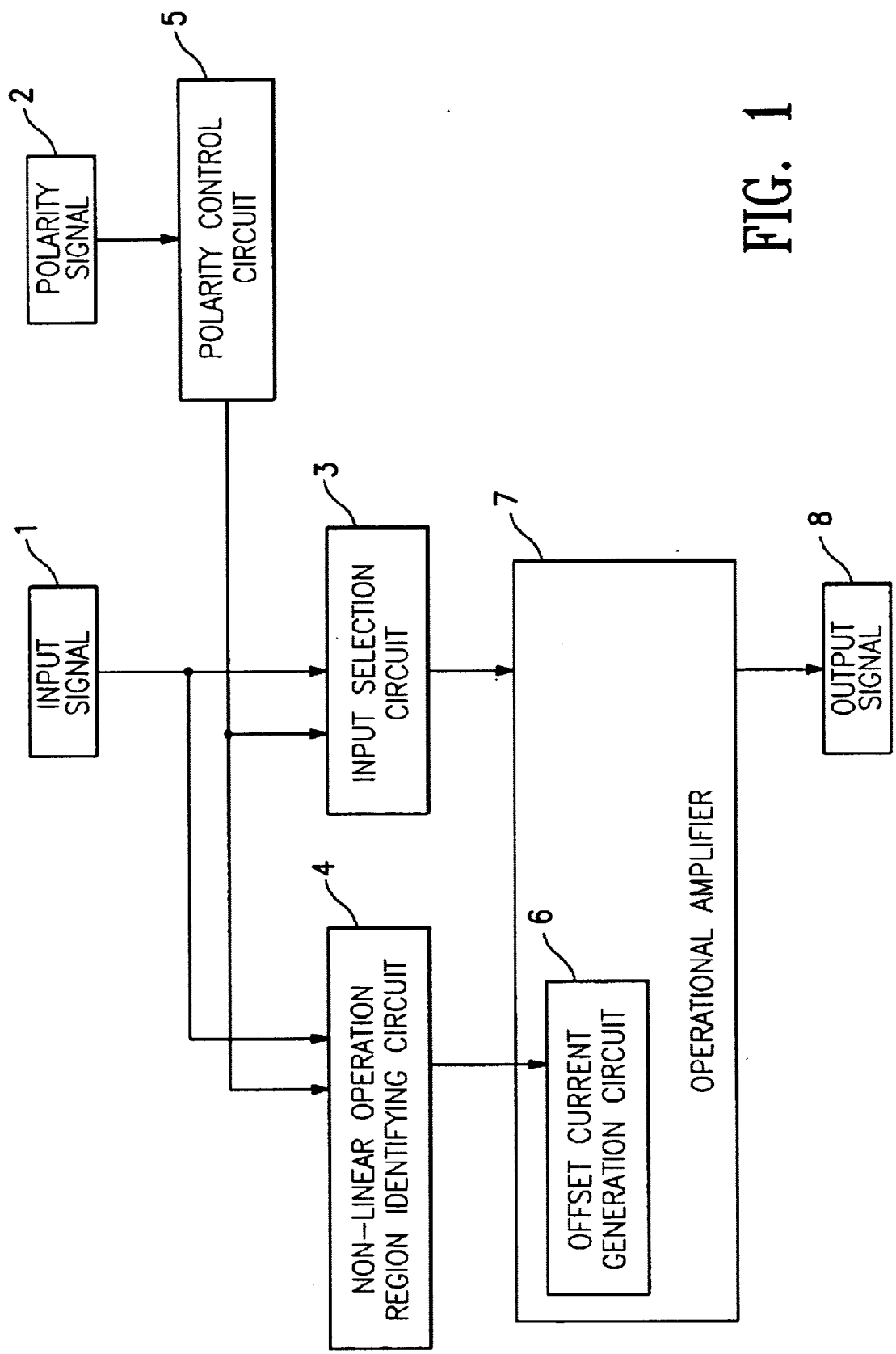
FIG. 1 shows a block diagram of a display drive device in accordance with a second embodiment of the present invention.

FIG. 1 shows a second embodiment of the present invention. In FIG. 1, the display drive device includes a polarity control circuit 5, an input selection circuit 3, a non-linear operation region identifying circuit 4 and an operational amplifier 7.

Figure 11:
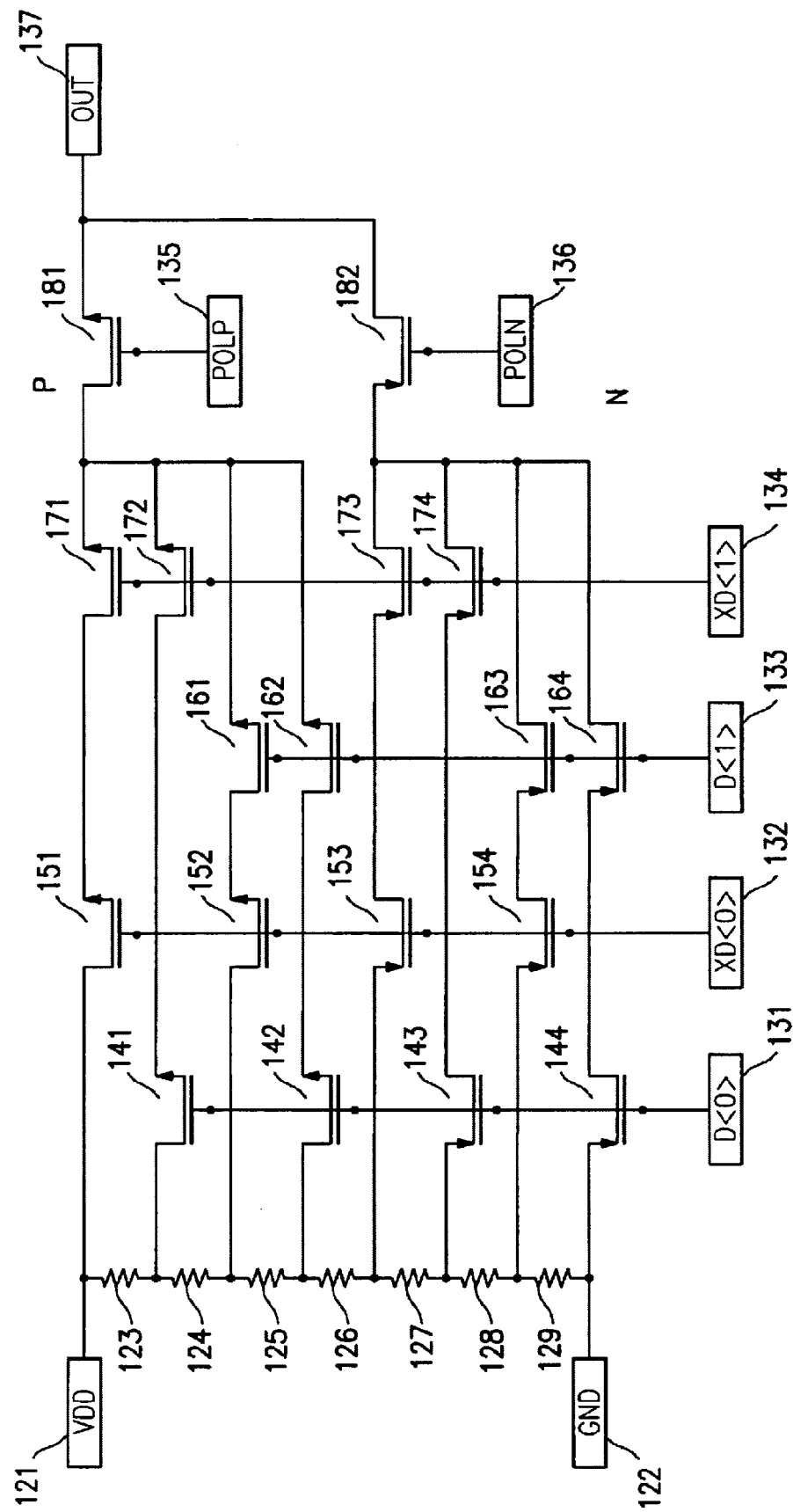
FIG. 11 shows a first example embodiment of an input selection circuit in accordance with the present invention.
Figure 13:
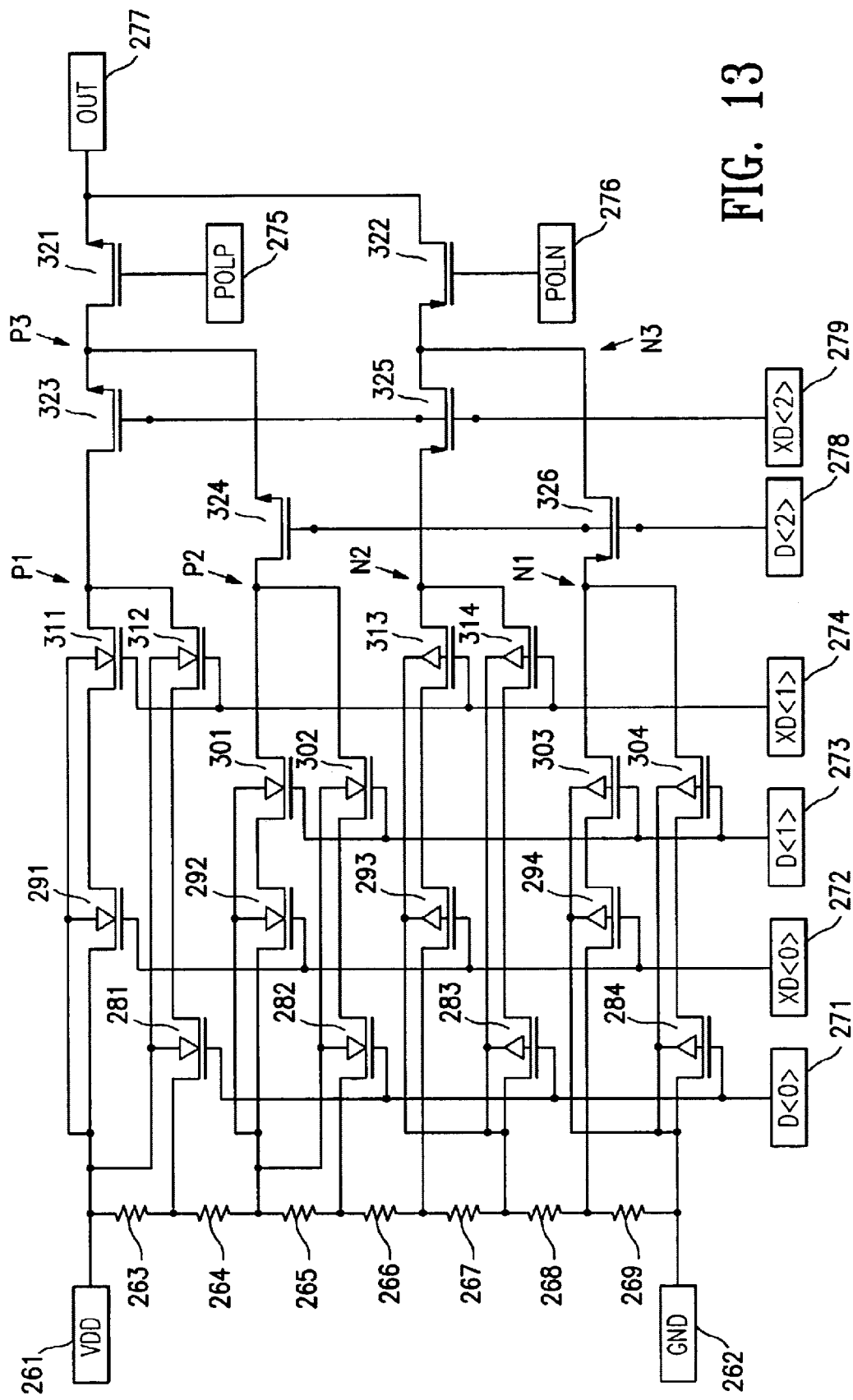
FIG. 13 shows a third example embodiment of an input selection circuit in accordance with the present invention.

A circuit shown in FIG. 11 or FIG. 13 may realize the input selection circuit 3. The input selection circuit 3 includes a circuit that generates a plurality of reference voltages with different values used to drive a liquid crystal display. In this embodiment, potentials derived by dividing the potential between the power supply potential and the ground with resistors may be used as the reference voltages. Also, reference voltages may be temperature-compensated with the temperature coefficient of liquid crystals to be driven. It may also include a function to alter the output voltage as instructed by the user to adjust contrast. The input selection circuit 3 is a circuit that selects, based on the input signal 1 and polarity control signal, a predetermined reference voltage for driving the liquid crystals from among a plurality of reference voltages generated within the input selection circuit 3. In this embodiment, input signals D<0>, D<1>, XD<0>, XD<1> are inputted and decoding takes place based on the input signals to select one reference voltage from among the reference voltages V0–V3 and one from among V4–V7. This circuit also provides an output with a polarity in accordance with a polarity control signal POLP or POLN. The structures of the polarity control circuit 5 and the operational amplifier 7 are the same as those in the best embodiment.

The polarity control circuit 5 outputs a polarity control signal in response to a polarity signal 2. The input selection circuit 3 inputs the polarity control signal and an input signal 1, selects based on these signals a predetermined voltage from among a plurality of reference voltages created within, and outputs the selected voltage to the operational amplifier 7. In the meantime, the non-linear operation region identifying circuit 4 identifies the non-linear operation regions based on the polarity control signal provided from the polarity control circuit and the input signal, and determines whether an offset current is required to compensate for the output signal current. If such offset current is required, a control signal to that effect is provided to the offset current generation circuit 6 inside the operational amplifier 7 from the non-linear operation region identifying circuit 4. The operational amplifier 7 amplifies the voltage and current based on the output voltage provided from the input selection circuit 3 and the supplemental current provided from the offset current generation circuit 6 that received the control signal, and outputs the output signal 8, which is previously a non-linear signal but now corrected to a linear signal.

Figure 2:
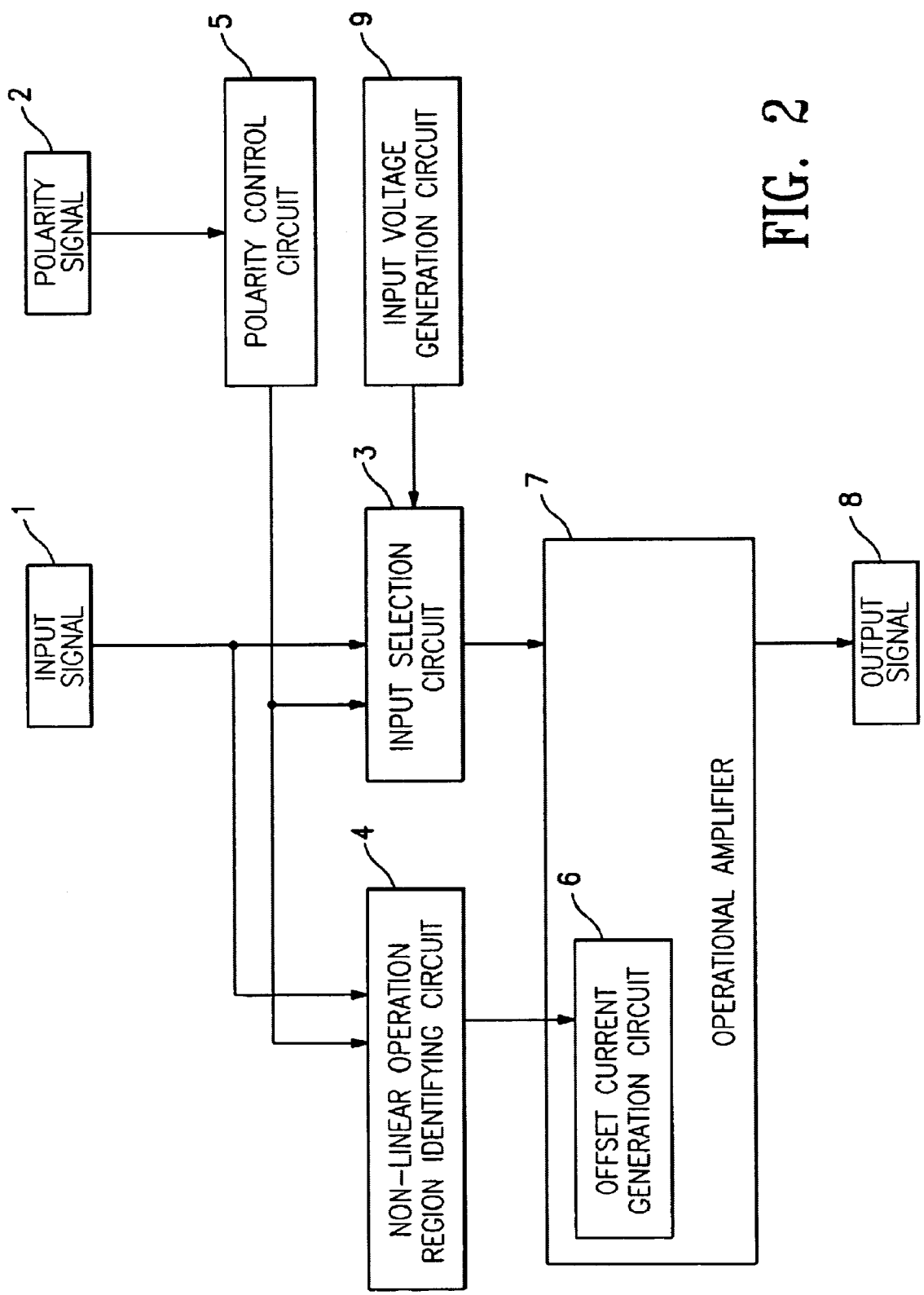
FIG. 2 shows a block diagram of a display drive device in accordance with a third embodiment of the present invention.

FIG. 2 shows a third embodiment of the present invention. The third embodiment adds an input voltage generation circuit 9 to the second embodiment in FIG. 1. The additional unit supplies a plurality of reference voltages to an input selection circuit 3, such as the one shown in FIG. 12 or FIG. 14. With the reference voltages and the supplemental current generated by the offset current generation circuit 6, the voltage and current are amplified to thereby provide an output signal 8 that is previously a non-linear signal but now corrected to a linear signal.

Figure 3:
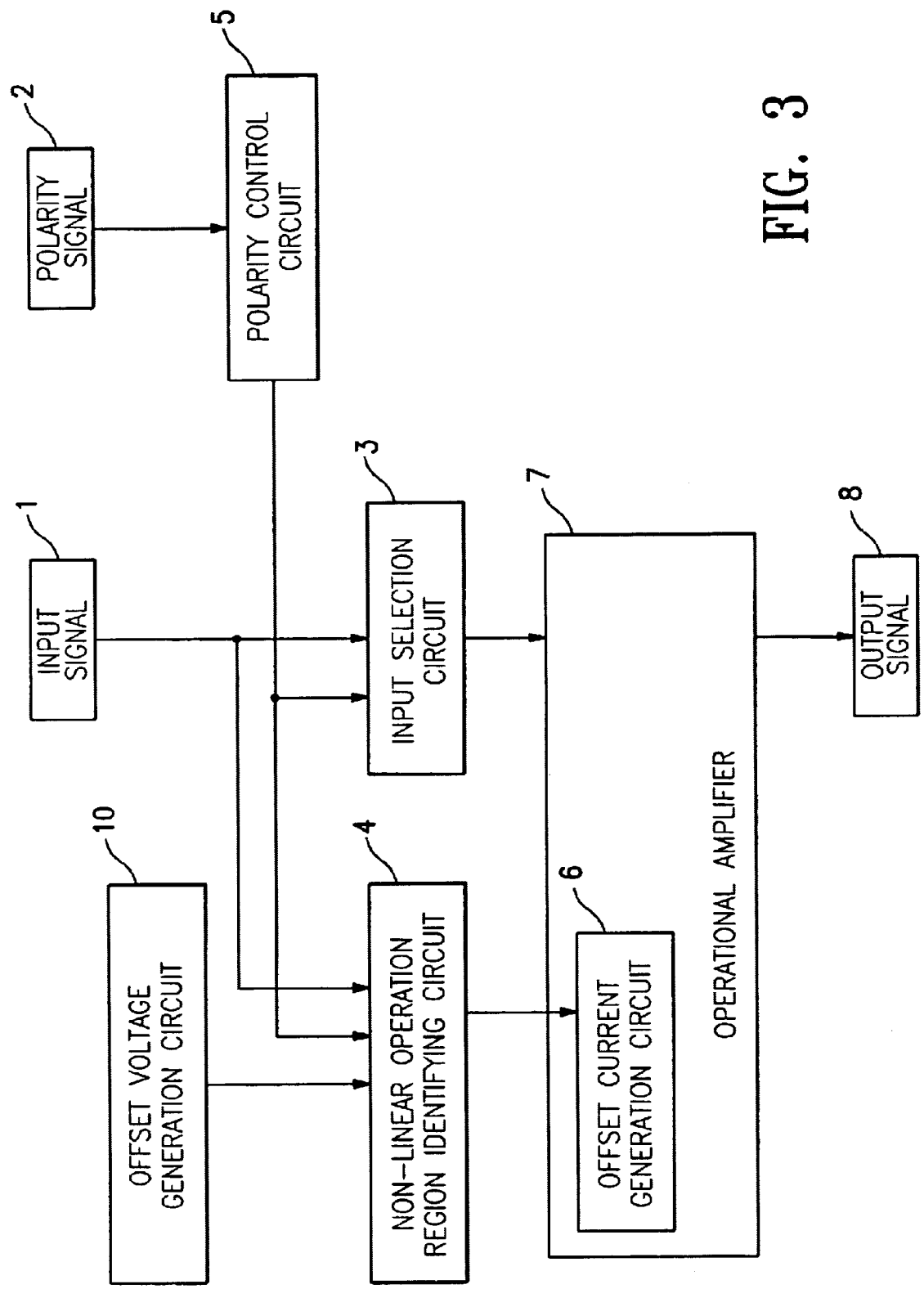
FIG. 3 shows a block diagram of a display drive device in accordance with a fourth embodiment of the present invention.

FIG. 3 shows a fourth embodiment of the present invention. The fourth embodiment adds an offset voltage generation circuit 30 to the second embodiment shown in FIG. 1. The offset voltage generation circuit 10 outputs a plurality of voltages with different values for offset current control purposes to the non-linear operation region identifying circuit 4. With this and the supplemental current generated by the offset current generation circuit 6, the voltage and current are amplified to thereby provide an output signal 8, which is previously a non-linear signal but now corrected as a linear signal.

Figure 5:
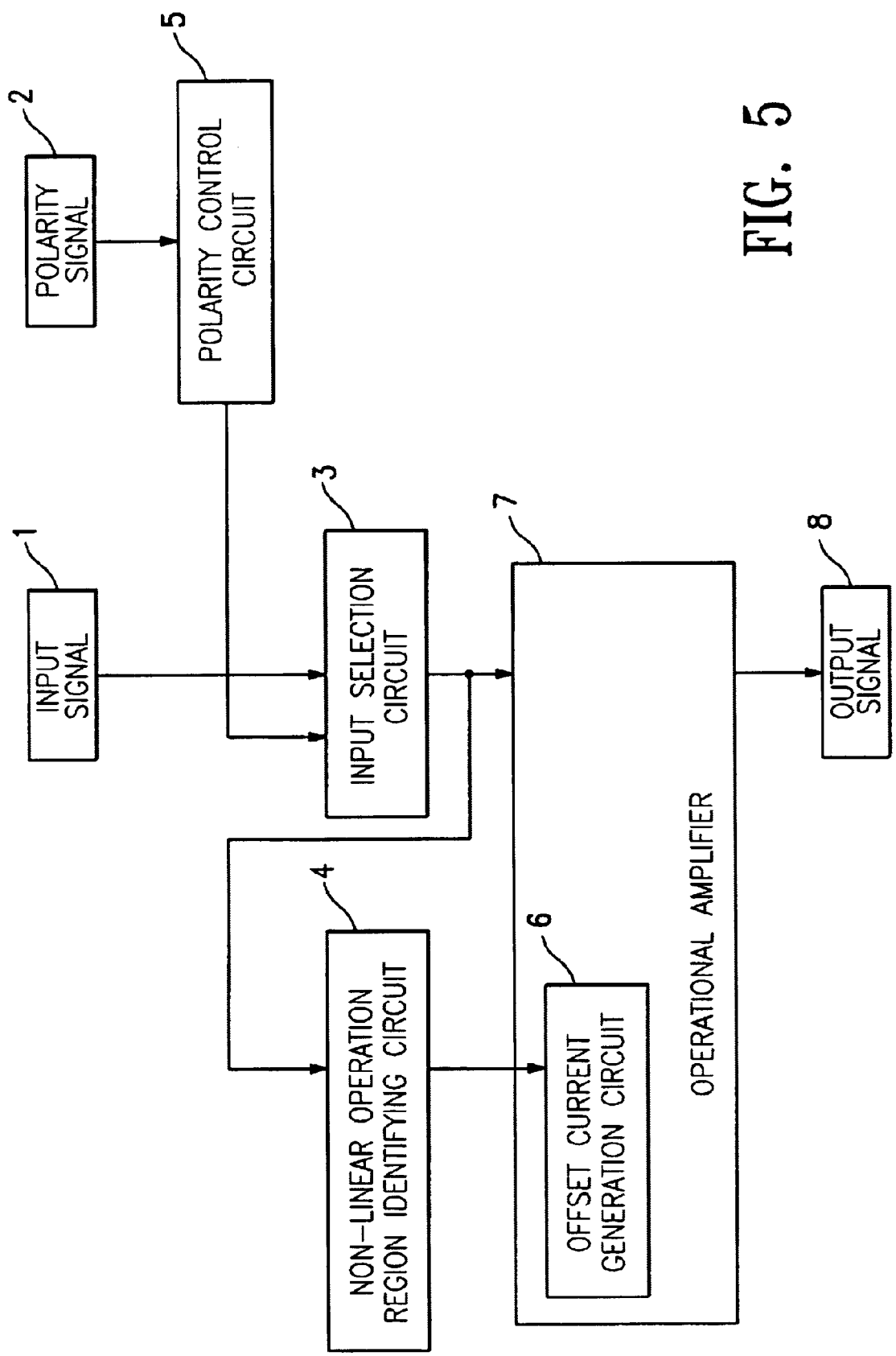
FIG. 5 shows a block diagram of a display drive device in accordance with a fifth embodiment of the present invention.

FIG. 5 shows a fifth embodiment of the present invention. The fifth embodiment differs from the second embodiment shown in FIG. 1 in that its non-linear operation region identifying circuit 4 performs identification based on the output voltage of an input selection circuit 3.

Figure 17:
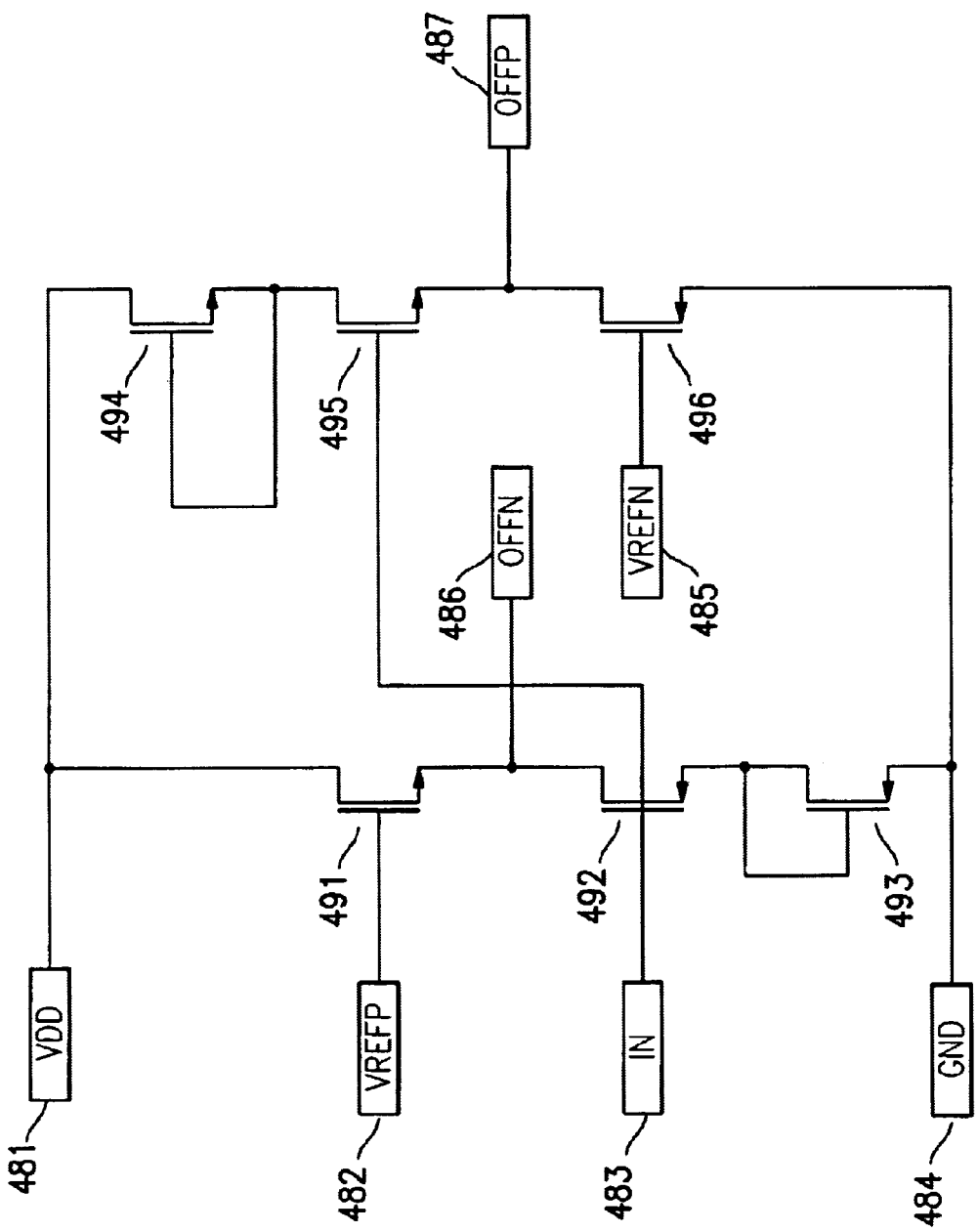
FIG. 17 shows a third example embodiment of a non-linear operation region identifying circuit in accordance with the present invention.

As an example of the non-linear operation region identifying circuit 4, the circuit shown in FIG. 17 may be used. IN 483 refers to a terminal that inputs signals from the input selection circuit 3. OFFN 486 and OFFP 487 refer to terminals that output offset current control signals. Input terminals VREFP 482 and VREFN 485 are offset voltage input terminals. VDD 481 and GND 484 are power supply terminals. Transistors 491, 494 and 495 are P-channel transistors; transistors 492, 493 and 496 are N-channel transistors.

Let us assume that the potential of the input signal IN 483 is falling. The potential of the gate of the transistor 493 also falls in response. As a result, the current flowing between the source and the drain of the transistor 493 is reduced. Since VREF 482 connected to the gate of the transistor 491 does not change, the transistor 491 operates to conduct a constant current. As a result, the resistance between the drain and the source of the transistor 491 is reduced. Consequently, the signal OFFN 486 rises and approaches the VDD 481.

Let us explain from another angle. When an appropriate potential is provided to the VREFP 482, each transistor size is set so that the OFFN 486 has a slightly higher (for example, 0.1V) potential than the N-channel transistor's threshold potential when the input signal IN 483 is in a region corresponding to the linear region of the operational amplifier, and each transistor size is set so that the OFFN 486 would have much higher (for example, 1.0V) potential than the N-channel transistor's threshold potential when the input signal IN 483 is in a non-linear operation region near the potential of the GND 484 of the operational amplifier. As a result, it becomes possible that hardly any current can flow in the linear region but a large amount of current can flow in the non-linear operation region to the N-channel transistor connected to the OFFN 486.

When an appropriate potential is provided to the VREFN 485, each transistor size is set so that the OFFP 487 has a slightly lower (for example, 0.1V) potential than the P-channel transistor's threshold potential when the input signal IN 483 is in a region corresponding to the linear region of the operational amplifier; and each transistor size is set so that the OFFP 487 would have much lower (for example, 1.0V) potential than the P-channel transistor's threshold potential when the input signal IN 483 is in a non-linear operation region near the VDD 481's potential of the operational amplifier 7. As a result, hardly any current can flow in the linear region but a large amount of current can flow in the non-linear operation region to the P-channel transistor connected to the OFFP 487. With this and the supplemental current generated by the offset current generation circuit 6, the voltage and current are amplified to thereby provide an output signal 8 which is previously a non-linear voltage but now corrected as a linear voltage.

Figure 6:
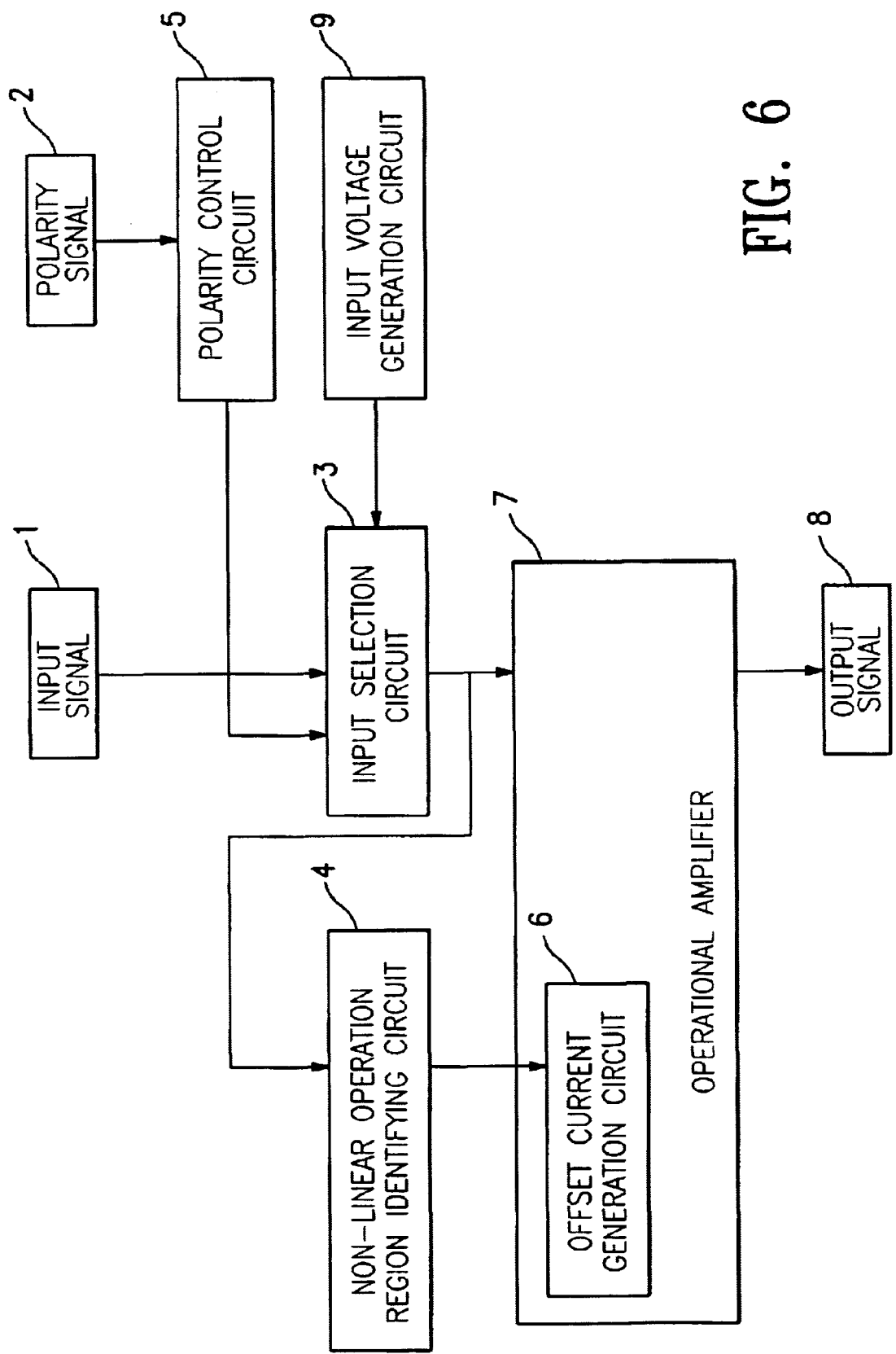
FIG. 6 shows a block diagram of a display drive device in accordance with a sixth embodiment of the present invention.

FIG. 6 shows a sixth embodiment of present invention. The sixth embodiment adds an input voltage generation circuit 9 to the fifth embodiment in FIG. 5. The input voltage generation circuit 9 supplies a plurality of reference voltages to an input selection circuit 3, such as the one shown in FIGS. 12 or 14. With this and the supplemental current generated by the offset current generation circuit 6, the voltage and current are amplified to thereby provide an output signal 8 which is previously a non-linear voltage but now corrected as a linear voltage.

Figure 7:
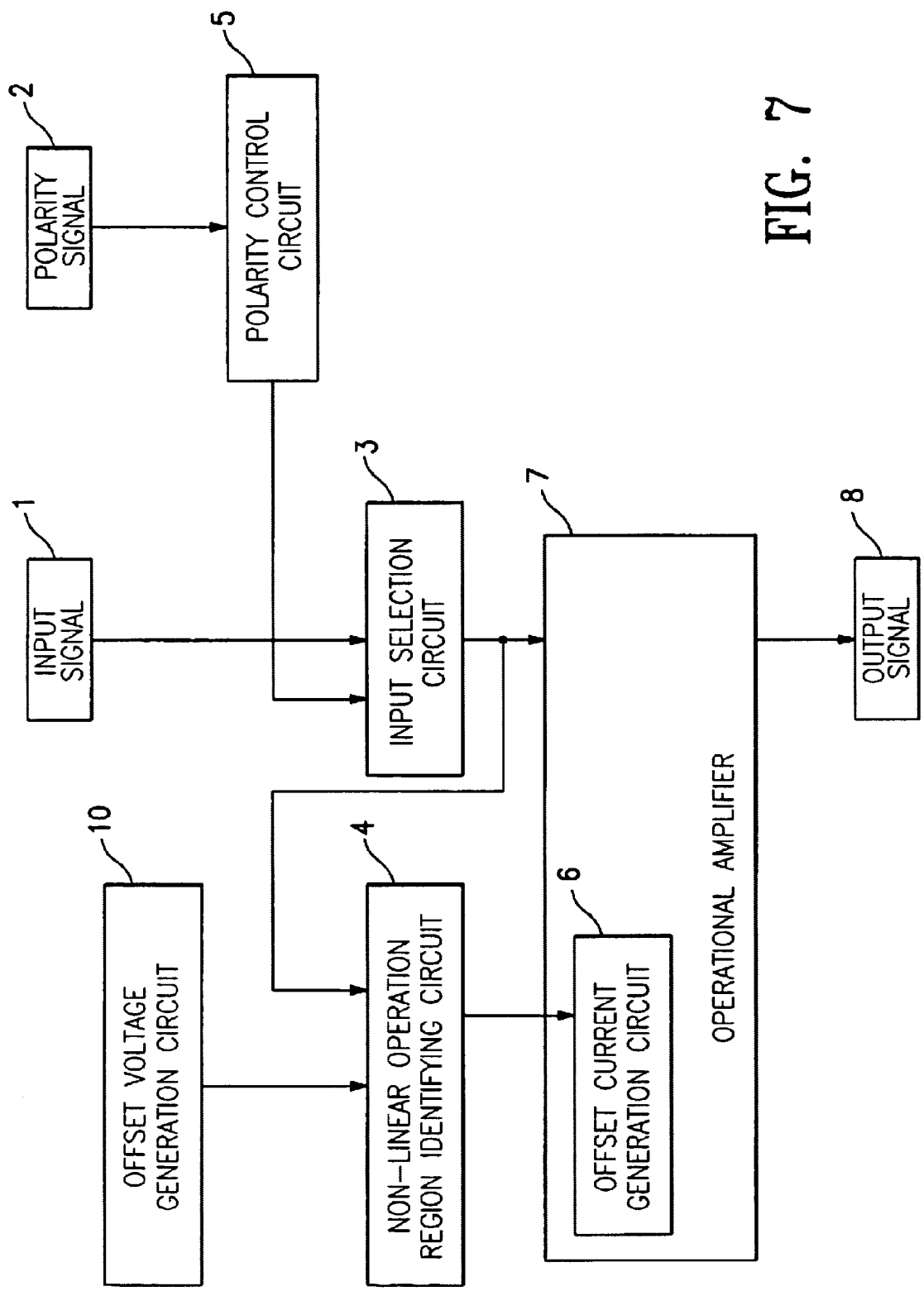
FIG. 7 shows a block diagram of a display drive device in accordance with a seventh embodiment of the present invention.

FIG. 7 shows a seventh embodiment of the present invention. The seventh embodiment adds an offset voltage generation circuit 10 to the fifth embodiment in FIG. 5. The offset voltage generation circuit 10 outputs a plurality of voltages with different values for offset current control purposes to the non-linear operation region identifying circuit 4. With this and the supplemental current generated by the offset current generation circuit 6, the voltage and current are amplified to thereby provide an output signal 8 which is previously a non-linear voltage but now corrected as a linear voltage.

Figure 8:
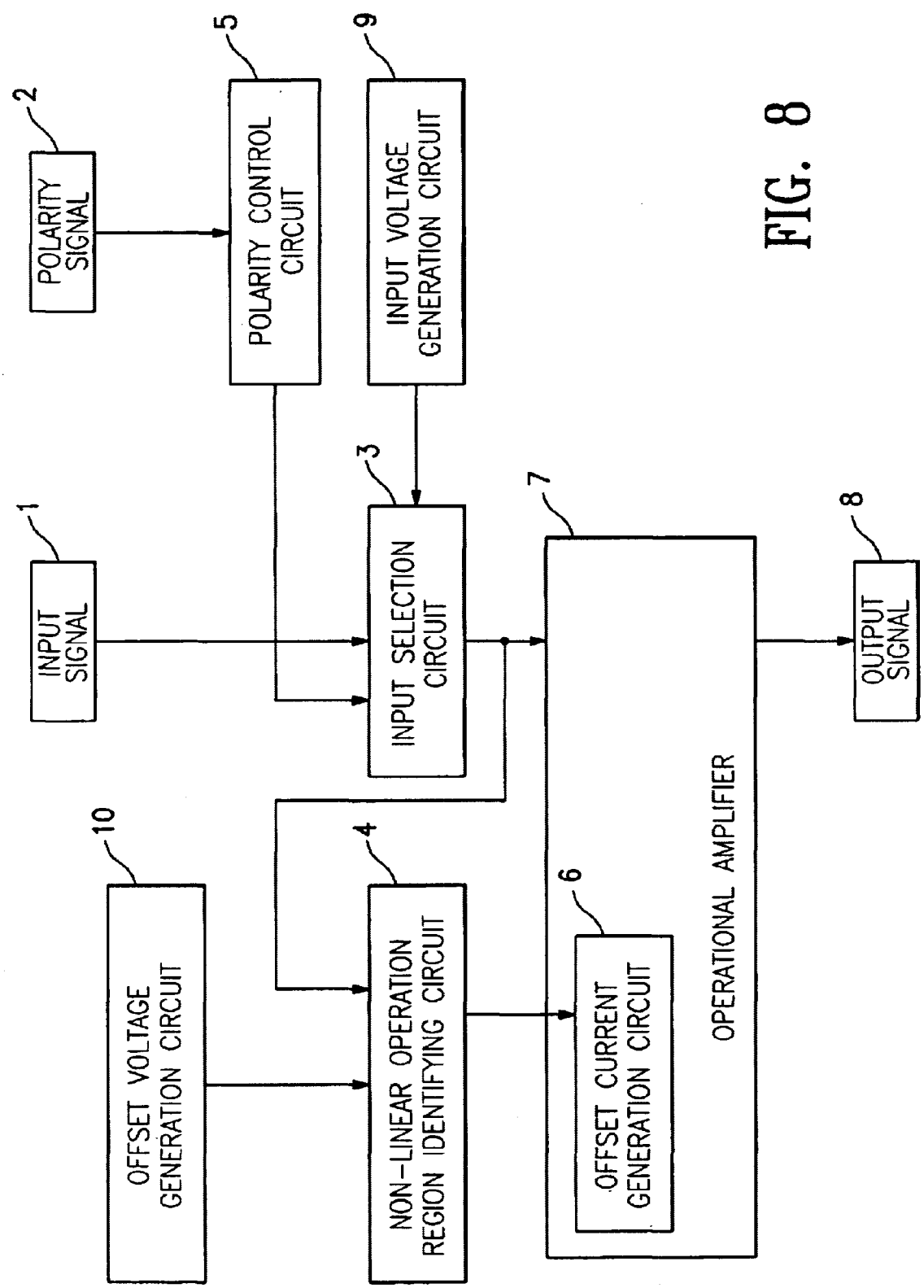
FIG. 8 shows a block diagram of a display drive device in accordance with an eighth embodiment of the present invention.

FIG. 8 shows an eighth embodiment of the present invention. The eighth embodiment adds an offset voltage generation circuit 10 to the sixth embodiment in FIG. 6. The offset voltage generation circuit 10 outputs a plurality of voltages with different values for offset current control purposes to the non-linear operation region identifying circuit 4. With this and the supplemental current generated by the offset current generation circuit 6, the voltage and current are amplified to thereby provide an output signal 8 which is previously a non-linear voltage but now corrected as a linear voltage.

FIG. 9 shows a polarity control circuit in accordance with a first embodiment of the present invention. As shown in FIG. 9, a polarity signal POL 81 is connected to a clock input of a flip-flop 82, and an inverted output XQ of the flip-flop 82 is connected to an input D of the flip-flop 82. Depending on the state change of the POL 81, the output Q and the output XQ of the flip clock 82 each changes from a high voltage level (hereinafter called "H level" or simply "H") to a low voltage level (hereinafter called "L level" or simply "L"), or from L level to H level. The output Q of the flip-flop 82 is connected to an input of logic circuits 86 and 87 to an input of a buffer 83. An output from the buffer 83 is connected to an input of a buffer 84. An output from the buffer 84 is provided to an input of a buffer 85. An output from the buffer 85 is connected to the logic circuit 86 and a logic circuit 87.

The logic circuit 86 may be a circuit that performs a logical product (AND), and the logic circuit 87 may be a circuit that performs a logical sum (OR). The objective of the buffers 83, 84 and 85 is to delay signals. They therefore do not have to be buffers.

Instead, they may be circuits such as inverters or delay elements. And the delay elements may be in any number of stages.

The rise of the output of the logic circuit 86 is delayed against the output of the logic circuit 87 by the time equivalent to the delay time provided by the buffers 83, 84 and 85. Its fall is faster by the time equivalent to the delay time provided by the buffers 83, 84 and 85.

When the power supply system of the polarity signal and the power supply system of the signal required as a polarity control signal are different, a level shifter 88 is connected to the output of the logic circuit 86 and a level shifter 89 is connected to the output of the logic element 87.

An output from the level shifter 88 is connected to an input of a buffer 90, and an output of the level shifter 89 is connected to a buffer 91.

When the power supply system of the polarity signal and the power supply system of the signal required as a polarity control signal are the same, the output from the logic circuit 86 may be connected to the input of the buffer 90 and the output from the logic circuit 87 may be connected to the input of the buffer 91.

An output from the buffer 90 is connected to a POL_P_ODD 94 of the polarity control terminal on the P-channel transistor of the odd-numbered output and to a logic circuit 93; an output from the buffer 91 is connected to a POL_N_ODD 95 of the polarity control terminal on the N-channel transistor of the odd-numbered output and to a logic circuit 92.

An output mode selection signal MODE 98 is connected to the other inputs of the logic circuits 92 and 93. An input signal from the MODE 98 given as an example here assumes that the power supply system of the MODE 98 is the same as the one required as the polarity control signal. Although not shown, when the power supply system of the MODE 98 is different from the power supply system required as the polarity control signal, a level shifter may be added between the MODE 98 and logic circuit 92 and/or between the MODE 98 and logic circuit 93. An output from the logic circuit 92 is connected to a POL_P_EVEN 96 of the polarity control terminal on the P-channel transistor of the even-numbered output. An output from the logic circuit 93 is connected to a POL_N_EVEN 97 of the polarity control terminal on the N-channel transistor of the even-numbered output.

When the logic circuits 92 and 93 have an exclusive OR function and when the MODE 98 is at H, the outputs from the buffers 90 and 91 may be controlled such that the outputs are logically inverted and thus adjacent outputs have opposite polarities.

When the MODE 98 is at L, outputs from the buffers 90 and 91 are outputted as they are. Consequently, adjacent outputs may be controlled so that they have the same polarity. Further, when the MODE 98 is not inputted, adjacent outputs may be controlled so that they have opposite polarities by using inverters in place of the logic circuits 92 and 93. Moreover, by using buffers instead of the logic circuits 92 and 93, adjacent outputs may be controlled so that they have the same polarity.

FIG. 10 shows a polarity control circuit in accordance with a second embodiment of the present invention. As shown in FIG. 10, a polarity signal POL 100 is connected to an input D of a flip-flop 102. A clock input of the flip-flop 102 is connected to a polarity timing signal LP 101. Depending on the state change of the LP 101, the Q and XQ of the flip-flop 102 each changes to the same logic state as the POL 100 and to the opposite logic state of the POL 100.

The output Q of the flip-flop 102 is connected to inputs of logic circuits 104 and 105. The LP 101 is connected to an input of an inverter 103, and an output of the inverter 103 is connected to the other inputs of the logic circuits 104 and 105, such that its rise can be delayed by the time equivalent to the H period of the LP 101. The logic circuits 104 and 105 may be circuits that realize a logical product (AND).

When the power supply system of the polarity signal and the power supply system of the signal required as a polarity control signal are different, a level shifter 106 is connected to the output of the logic circuit 104 and a level shifter 107 is connected to the output of the logic element 105. An output from the level shifter 106 is connected to an input of a buffer 108, and an output from the level shifter 107 is connected to an input of a buffer 109.

When the power supply system of the polarity signal and the power supply system of the signal required as a polarity control signal are the same, the output from the logic circuit 104 may be connected to the input of the buffer 108 and the output from the logic circuit 105 may be connected to the input of the buffer 109.

The output from the buffer 108 is connected to a POL_P_ODD 112 of an input of the polarity control terminal on the P-channel transistor of the odd-numbered output and to a logic circuit 111; the output from the buffer 109 is connected to a POL_N_ODD 113 of the polarity control terminal on the N-channel transistor of the odd-numbered output and to an input of logic circuit 110.

A output mode selection signal MODE 118 is connected to the other inputs of the logic circuits 110 and 111. An output from the logic circuit 110 is connected to a POL_P_EVEN 114 of the polarity control terminal on the P-channel transistor of the even-numbered output, and an output from the logic circuit 111 is connected to a POL_N_EVEN 115 of the polarity control terminal on the N-channel transistor of the even-numbered output. When the logic circuits 110 and 111 have an exclusive OR function and when the MODE 118 is at H, the outputs from the buffers 108 and 109 may be controlled such that the outputs are logically inverted and thus adjacent outputs have opposite polarities.

When the MODE 118 is at L, outputs from the buffers 108 and 109 are outputted as they are. Consequently, adjacent outputs may be controlled so that they have the same polarity.

Further, when the MODE 118 is not inputted, adjacent outputs may be controlled so that they have opposite polarities by using inverters instead of the logic circuits 110 and 111.

Moreover, by using buffers instead of the logic circuits 110 and 111, adjacent outputs may be controlled so that they have the same polarity.

FIG. 11 shows the input selection circuit in accordance with a first embodiment of the present invention. As shown in FIG. 11, input terminals VDD 121 and GND 122 are power supply terminals, and resistors 123–129 are division resistors that divide power supply voltage. D<0>131, XD<0>132, D<1>133, and XD<1>134 are all input signals. Each of the pairs D<0>131 and XD<0>132, and D<1>133 and XD<1>134 forms opposing logics. Transistors 141, 142, 151, 152, 161, 162, 171 and 172 are P-channel transistors. Transistors 143, 144, 153, 154, 163, 164, 173 and 174 are N-channel transistors. A transistor 181 is a P-channel transistor, and a transistor 182 is an N-channel transistor.

When the logic of the signal D<0>131 is at H and the logic of the signal D<1>133 is at H, the transistors 151, 171, 144 and 164 turn on. Consequently, the point P has a potential of a VDD 121 and the N point has a potential of a GND 122.

When the logic of the signal D<0>131 is at L and the logic of the signal D<1>133 is at H, the transistors 141, 172, 154 and 163 turn on. Consequently, the point P has a potential of the connection node of the resistors 123 and 124 and the point N has a potential of the connection node of the resistors 128 and 129. Similarly, when the logic of the signal D<0>131 is at H and the logic of the signal D<1>133 is at L, the point P has a potential of the connection node of the resistors 124 and 125 and the point N has a potential of the connection node of the resistors 127 and 128. When the logic of the signal D<0>131 is at L and the logic of the signal D<1>132 is at L, the point P has a potential of the connection node of the resistors 125 and 126 and the point N has a potential of the connection node of the resistors 126 and 127. In this way, voltages obtained by dividing the VDD 121 and the GND 122 with the resistors can be selectively output to the point P and the point N, respectively, in accordance with the input signals.

When signals POLP 135 and POLN 136 provided from the polarity control circuit 5 are at L, the potential of the point P is outputted to an OUT 137. When the POLP 135 and POLN 136 are at H, the potential of the point N is outputted to the OUT 137.

When the drain capacitance present at the points P and N and the parasitic capacitance existing due to wirings and otherwise are sufficiently larger than the capacitance that is present at the OUT 137 terminal, the potential of the point P will not be lower than half of the value of the potential difference between the VDD 121 and the GND 122. And the potential of the point N will not be higher than half of the value of the potential difference between the VDD 121 and the GND 122. For this reason, transistors with a dielectric strength enough to withstand a half of the potential difference between the VDD 121 and the GND 122 may be used for the transistors 141 through 174.

The input signals do not have to be the four signals D<0>131, XD<0>132, D<1>133 and XD<1>134. By increasing the number of input signals, the number of potentials that can be provided to the OUT 137 can be increased.

FIG. 12 shows the input selection circuit 3 in accordance with a second embodiment of the present invention. As shown in FIG. 12, input terminals V0 (191) through V7 (198) are provided from the input voltage generation circuit 9. D<0>201, XD<0>202, D<1>203, and XD<1>204 are all input signals. Each of the pairs D<0>201 and XD<0>202, and D<1>203 and XD<1>204 forms opposing logics. Transistors 211, 212, 221, 222, 231, 232, 241 and 242 are P-channel transistors. Transistors 213, 214, 223, 224, 233, 234, 243 and 244 are N-channel transistors. A transistor 251 is a P-channel transistor, and a transistor 252 is an N-channel transistor.

When the logic of the signal D<0>201 is at H and the logic of the signal D<1>203 is at H, the transistors 221, 241, 214 and 234 turn on. Consequently, the point P has a potential of the V0 (191) and the point N has a potential of the V7 (198). When the logic of the signal D<0>201 is at L and the logic of the signal D<1>203 is at H, the transistors 211, 242, 224 and 233 turn on. Consequently, the point P has a potential of the V1 (192) and the point N has a potential of the V6 (197). Similarly, when the logic of the signal D<0>201 is at H and the logic of the signal D<1>203 is at L, the point P has a potential of the V2 (193) and the point N has a potential of the V5 (196). When the logic of the signal D<0>201 is at L and the logic of the signal D<1>203 is at L, the point P has a potential of the V3 (194) and the point N has a potential of the V4 (195). In this way, input voltage of the V0 (191) through the V7 (198) can be selectively output to the points P and N with input signals.

When signals POLP 205 and POLN 206 from the polarity control circuit 5 are at L, the potential of the point P is outputted to an OUT 207. When the POLP 205 and POLN 206 are at H, the potential of the point N is outputted to the OUT 207.

When the drain capacitance present at the points P and N and the parasitic capacitance existing due to wirings and otherwise are sufficiently larger than the capacitance existing at the OUT 207 terminal, the potential of the point P will not be lower than half of the value of the potential difference between the V0 (191) and the V7 (198), and the potential of the point N will not be higher than half of the value of the potential difference between the V0 (191) and the V7 (198). For this reason, transistors with a dielectric strength enough to withstand a half of the potential difference between the V0 (191) and V7 (198) may be used for the transistors 211 through 244.

The input signals do not have to be the four input signals, i.e., D<0>201, XD<0>202, D<1>203 and XD<1>204, and the number of input terminals connecting to the input voltage generation circuit 9 do not have to be eight, i.e., V0 (191) through V7 (198). By increasing the number of input signals and the number of input terminals connecting to the input voltage generation circuit 9, the number of potentials that can be generated to the OUT 207 can be increased.

In addition, the number of the input voltage from the input voltage generation circuit 9 to the input terminals may be apparently increased by dividing the input voltage with resistors.

FIG. 13 shows the input selection circuit 3 in accordance with a third embodiment of the present invention. Referring to FIG. 13, input terminals VDD 261 and GND 262 are power supply terminals, and resistors 263 through 269 are division resistors that divide power supply voltage. D<0>271, XD<0>272, D<1>273, XD<1>274, D<2>278 and XD<2>279 are all input signals. Each of the pairs D<0>271 and XD<0>272, D<1>273 and XD<1>274, and D<2>278 and XD<2>279 forms opposing logics.

Transistors 281, 282, 291, 292, 301, 302, 311 and 312 are P-channel transistors. The well potentials of the transistors 281, 292, 311 and 312 are potentials supplied at the VDD 261. The well potentials of the transistors 282, 292, 301 and 302 are potentials supplied at the connection node of the resistors 264 and 265. Transistors 283, 284, 293, 294, 303, 304, 313 and 314 are N-channel transistors. The well potentials of the transistors 284, 294, 303 and 304 are potentials supplied at the GND 262. The well potentials of the transistors 283, 293, 313 and 314 are potentials at the connection node of the resistors 267 and 268. Transistors 321, 323 and 324 are P-channel transistors. Transistors 322, 325 and 326 are N-channel transistors.

When the logic of the signal D<0>271 is at H and the logic of the signal D<1>273 is at H, the transistors 291, 311, 284 and 304 turn on. Consequently, a point P1 has a potential of the VDD 261 and a point N1 has a potential of the GND 262. When the logic of the signal D<0>271 is at L and the logic of the signal D<1>273 is at H, the transistors 281, 312, 294 and 303 turn on. Consequently, the point P1 has a potential of the connection node of the resistors 263 and 264. The point N1 has a potential of the connection node of the resistors 268 and 269.

Similarly, when the logic of the signal D<0>271 is at H and the logic of the signal D<1>273 is at L, a point P2 has a potential of the connection node of the resistors 264 and 265. A point N2 has a potential of the connection node of the resistors 267 and 268. When the logic of the signal D<0>271 is at L and the logic of the signal D<1>273 is at L, the point P2 has a potential of the connection node of the resistors 265 and 266. The point N2 has a potential of the connection node of the resistors 266 and 267. When the logic of the signal D<2>278 is at H, transistors 323 and 326 turn on. When this happens, the potential of the P1 is outputted to a point P3, and the potential of the N1 is outputted to an N3. When the logic of the signal D<2>278 is at L, transistors 324 and 325 turn on, the potential of the P2 is outputted to the P3, and the potential of the N2 is output to the N3.

In this way, voltages obtained by dividing the VDD 261 and the GND 262 with resistors according to the input signals can be selectively outputted to the points P3 and N3, respectively.

When signals POLP 275 and POLN 276 provided from the polarity control circuit are at L, the voltage of the point P3 is outputted to an OUT 277. When the POLP 275 and POLN 276 are at H, the voltage of the point N3 is outputted to the OUT 277.

When the drain capacitance present at the points P3 and N3 and the parasitic capacitance existing due to wirings and otherwise are sufficiently larger than the capacitance that is present at the OUT 277 terminal, the potential of the point P3 will not be lower than a half of the value of the potential difference between the VDD 261 and the GND 262, and the potential of the point N3 will not be higher than a half of the value of the potential difference between the VDD 261 and the GND 262. For this reason, transistors with a dielectric strength equivalent to a half of the potential difference between the VDD 261 and the GND 262 may be used for the transistors 323 through 326.

Similarly, when the drain capacitance present at the points P1 and N1 and at the points P2 and N2, and the parasitic capacitance existing due to wirings and otherwise are sufficiently larger than the capacitance present at the points P3 and N3, the potential of neither the point P1 nor P2 will be lower than a half of the value of the potential difference between the VDD 261 and the connection node of resistors 265 and 266, and the potential of neither the point N1 nor N2 will be higher than a half of the value of the potential difference between the connection node of resistors 266 and 267 and the GND 262. For this reason, transistors with a dielectric strength equivalent to a quarter of the potential difference between the VDD 261 and the GND 262 may be used for the transistors 281 through 314.

By providing divided wells against input voltages and selecting appropriate input voltages in the manner described above, transistors with a small dielectric strength can be used, which allows miniaturization of the transistors.

The input signals do not have to be the four signals D<0>271, XD<0>272, D<1>273 and XD<1>274. The number of input signals may be increased, so that the number of potentials to be provided to the OUT 277 can be increased.

FIG. 14 shows the input selection circuit 3 in accordance with a fourth embodiment of the present invention. As shown in FIG. 14, input terminals V0 (331) through V7 (338) are input terminals connecting to the input voltage generation circuit. D<0>341, XD<0>342, D<1>343, XD<1>344, D<2>348 and XD<2>349 are all input signals. Each of the pairs D<0>341 and XD<0>342, D<1>343 and XD<1>344, and D<2>348 and XD<2>349 forms opposing logics. Transistors 351, 352, 361, 362, 371, 372, 381 and 382 are P-channel transistors. The well potentials of the transistors 361, 381, 351 and 382 are at a potential given at the V0 (331). The well potentials of the transistors 352, 362, 371 and 372 are at a potential given at the V2 (333). Transistors 353, 354, 363, 364, 373, 374, 383 and 384 are N-channel transistors. The well potentials of the transistors 354, 364, 373 and 374 are at a potential given at the V7 (338). The well potentials of the transistors 353, 363, 383 and 384 are at a potential given at the V5 (336). Transistors 391, 393 and 394 are P-channel transistors. Transistors 392, 395 and 396 are N-channel transistors.

When the logic of the signal D<0>341 is at H and the logic of the signal D<1>343 is at H, the transistors 361, 381, 354 and 374 turn on. Consequently, a point P1 has a potential of the V0 (331) and a point N1 has a potential of the V7 (338). When the logic of the signal D<0>341 is at L and the logic of the signal D<1>343 is at H, the transistors 351, 382, 364 and 373 turn on. Consequently, the point P1 has a potential of the V1 (332) and the point N1 has a potential of the V6 (337). Similarly, when the logic of the signal D<0>341 is at H and the logic of the signal D<1>343 is at L, a point P2 has a potential of the V2 (333) and a point N2 has a potential of the V5 (336). When the logic of the signal D<0>341 is at L and the logic of the signal D<1>343 is at L, the point P2 has a potential of the V3 (334) and the point N2 has a potential of the V4 (335).

When the logic of the signal D<2>348 is at H, the transistors 393 and 396 turn on, and the potential of the P1 is outputted to a point P3 and the potential of the N1 is outputted to a point N3. When the logic of the signal D<2>348 is at L, transistors 394 and 395 turn on, and the voltage of the point P2 is outputted to the point P3 and the voltage of the point N2 is outputted to the point N3.

In this way, input voltages of the V0 (331) through V7 (338) can be selectively outputted to the points P3 and N3 according to the input signals.

When signals POLP 345 and POLN 346 provided from the polarity control circuit are at L, the potential of the point P3 is outputted to an OUT 347. When the POLP 345 and POLN 346 are at H, the potential of the point N3 is outputted to the OUT 347.

When the drain capacitance that is present at the points P3 and N3 and the parasitic capacitance existing due to wirings and otherwise are sufficiently larger than the capacitance that is present at the OUT 347 terminal, the potential of the point P3 will not be lower than half of the value of the potential difference between the V0 (331) and V7 (338) and the potential of the point N3 will not be higher than half of the value of the potential difference between the V0 (331) and V7 (338). For this reason, transistors with a dielectric strength enough to withstand a half of the potential difference between the V0 (331) and the V7 (338) may be used for the transistors 393 through 396.

Similarly, when the drain capacitance that is present at the points P1 and P2 and at the points N1 and N2, and the parasitic capacitance existing due to wirings and otherwise are sufficiently larger than the capacitance that is present at the points P3 and N3, the potential of neither the point P1 nor P2 will ever be lower than half of the value of the potential difference between V0 (331) and V3 (334), and the potential of neither the point N1 nor N2 will ever be higher than half of the value of the potential difference between the V4 (335) and V7 (338). For this reason, transistors with a dielectric strength enough to withstand one-fourth of the potential difference between the V0 (331) and the V7 (338) may be used for the transistors 351 through 384.

By providing divided wells against input voltages and selecting appropriate input voltages in the manner described above, transistors with a small dielectric strength can be used, which allows miniaturization of the transistors.

The input signals do not have to be the four signals D<0>341, XD<0>342, D<1>343 and XD<1>344. The number of input signals may be increased, so that the number of potentials that can be provided to the OUT 347 can be increased.

In addition, the input voltage from the input voltage generation circuit may be divided with resistors so that the number of input voltages to the input terminals may be apparently increased.

FIG. 15 shows an even-numbered terminal circuit in the non-linear operation region identifying circuit 4 in accordance with a first embodiment of the present invention. FIG. 15 shows input terminals VREFP 1 (401), VREFP 2 (402), VREFN 1 (404) and VREFN 2 (405) that input offset current control voltages and signals from the offset voltage generation circuit 10. VDD 403 and GND 406 are power supply terminals. D<4>407, XD<4>408, D<5>409 and XD<5>410 are all inputs signals. Each of the pairs D<4>407 and XD<4>408, and D<5>409 and XD<5>410 form opposing logics. Transistors 421, 422, 424, 425 and 423 are P-channel transistors. Transistors 431, 432, 434, 435 and 433 are N-channel transistors.

When the logic of the signal D<4>407 is at H and the logic of the signal D<5>409 is at H, the transistors 421, 422, 431 and 432 turn on. Consequently, a point P has the potential of the VREFP 1 (401) and a point N has the potential of the VREFN 1 (404). When the logic of the signal D<4>407 is at L and the logic of the signal D<5>409 is at H, the transistors 424, 425, 434 and 435 turn on. Consequently, the point P has the potential of the VREFP 2 (402) and the point N has the potential of the VREFN 2 (405). When in other logic states, the points P and N are in a high impedance state.

POLP_ODD 411, POLP_EVEN 412, POLN_EVEN 413 and POLN_ODD 414 refer to input terminals connecting to the polarity control circuit. The signals change cyclically.

When the logic at the POLP_EVEN 412 is at H, the logic at the POLP_ODD 411 is at L, and the potential of VDD 403 is outputted to an output terminal OFFP_EVEN 415. When the logic at the POLP_EVEN 412 is at L, the logic at the POLP_ODD 411 is at H, and the potential of the point P is outputted to the output terminal OFFP_EVEN 415. When the logic at the POLN_EVEN 413 is at L, the logic at the POLN_ODD 414 is at H, and the potential of the GND 403 is outputted to an output terminal OFFN_EVEN 416. When the logic at the POLN_EVEN 413 is at H, the logic at the POLP_ODD 414 is at L, and the potential of the point N is outputted to the output terminal OFFN_EVEN 416.

In this manner, a plurality of potentials can be selected according to input signals, and a power supply voltage can be outputted when no selection is made.

A non-linear operation region identifying circuit 4 for odd-numbered terminal output can be structured by interchanging the POLP_EVEN 412 and POLP_ODD 411 terminals and interchanging the POLN_EVEN 413 and POLN_ODD 414 terminals.

FIG. 16 shows an even-numbered terminal circuit in the non-linear operation region identifying circuit 4 in accordance with a second embodiment of the present invention. FIG. 16 shows input terminals VREFP 1 (441), VREFP 2 (442), VREFN 1 (444) and VREFN 2 (445) that input the offset current control voltage and the signals from the offset voltage generation circuit 10. VDD 443 and GND 446 are power supply terminals. D<4>447, XD<4>448, D<5>449 and XD<5>450 are all inputs signals. Each of the pairs D<4>447 and XD<4>448, and D<5>449 and XD<5>450 forms opposing logics. Transistors 461, 462, 464, 465, 463 and 467 are P-channel transistors. Transistors 471, 472, 474, 475, 473 and 477 are N-channel transistors. POLP_EVEN 452, POLP_ODD 451, POLN_EVEN 453 and POLN_ODD 454 refer to input terminals connecting to the polarity control circuit 5. These signals change cyclically. POLP_EVEN 452 and POLP_ODD 451 have logically opposite polarities to each other, and POLN_EVEN 453 and POLN_ODD 454 have logically opposite polarities to each other.

When the logic of the signal D<4>447 is at H, the logic of the signal D<5>449 is at H, and the logic at the POLP_EVEN 452 is at L, the transistors 461, 462 and 463 turn on. Consequently the OFFP_EVEN 455 has a potential of the VREFP1 (441). When the logic of the signal D<4>447 is at L, the logic of the signal D<5>449 is at H, and the logic at the POLP_EVEN 452 is at L, the transistors 464, 465 and 467 turn on. Consequently, the OFFP_EVEN 455 has a potential of the VREFP2 (442). When the logic at the POLP_ODD 451 is at L, the OFFP_EVEN 455 has a potential of the VDD 443. When the logic of the signal D<4>447 is at H, the logic of the signal D<5>449 is at H, and the logic at the POLN_EVEN 453 is at H, the transistors 471, 472 and 473 turn on. Consequently, the OFFN_EVEN 456 has a potential of the VREFN1 (444). When the logic of the signal D<4>447 is at L, the logic of the signal D<5>449 is at H, and the logic at the POLN_EVEN 453 is at H, the transistors 474, 475 and 477 turn on. Consequently, the OFFN_EVEN 456 has a potential of the VREFN2 (445). When the logic at the POLN_ODD 454 is at H, the OFFN_EVEN 456 has the potential of the GND 446.

In this way, a plurality of potentials can be selected according to input signals, and the power supply voltage can be outputted when no selection is made.

A non-linear operation region identifying circuit 4 for odd-numbered terminal output can be structured by interchanging the POLP_EVEN 452 and POLP_ODD 451 terminals and interchanging the POLN_EVEN 453 and POLN_ODD 454 terminals.

FIG. 18 shows an example of an operational amplifier 7 and an offset current generation circuit 6 within the operational amplifier 7 in accordance with one embodiment of the present invention. As shown in FIG. 18, the input terminal VDD 501 supplies positive power for the operational amplifier 7 and the offset current generation circuit 6, and VSS 503 supplies negative power for the operational amplifier 7 and the offset current generation circuit 6. Terminals IN 502, VREF_P 505 and VREF_N 504 are input terminals of the operational amplifier 7. Terminals OFF_P 507 and OFF_N 508 are input terminals of the offset current generation circuit 6. The terminal OUT 506 is an output terminal of the operational amplifier 7 and of the offset current generation circuit 6.

Transistors 514 and 515 are P-channel transistors. Transistors 512, 513 and 511 are N-channel transistors. The transistors 512 and 513 form a differential pair, and the transistors 511, 512, 513, 514 and 515 form the differential unit 1.

The gate of the transistor 511 connects to the terminal VREF_N 504, and controls the current of the differential unit 1. The source of the transistor 511 connects to the terminal VSS 503, and the drain of the transistor 511 connects to the sources of the transistors 512 and 513. The terminal IN 502 is connected to the gate of the transistor 512. The drain of the transistor 514, the gate of the transistor 514 and the gate of the transistor 515 are connected to the drain of the transistor 512. The terminal OUT 506 is connected to the gate of the transistor 513. The drain of the transistor 515 is connected to the drain of the transistor 513. The terminal VDD 501 is connected to the source of the terminal 514. The terminal VDD 501 is connected to the source of the transistor 515. The transistors 514 and 515 form a current mirror circuit, which is structured so that the current conducted to the transistor 514 and to the transistor 515 are the same.

Transistors 519 and 520 are N-channel transistors. Transistors 517, 518 and 516 are P-channel transistors. The transistors 517 and 518 form a differential pair, and the transistors 516, 517, 518, 519 and 520 form the differential unit 2.

The terminal VREF_P 505 is connected to the gate of the transistor 516 and controls the current of the differential unit 2. The terminal VDD 501 is connected to the source of the transistor 516, and the sources of the transistors 517 and 518 are connected to the drain of the transistor 516. The terminal IN 502 is connected to the gate of the transistor 517. The drain of the transistor 519, the gate of the transistor 519 and the gate of the transistor 520 are connected to the drain of the transistor 517. The terminal OUT 506 is connected to the gate of the transistor 518, and the drain of the transistor 520 is connected to the drain of the transistor 518. The terminal VSS 503 is connected to the source of the transistor 519, and the terminal VSS 503 is connected to the source of the transistor 520.

The transistors 519 and 520 form a current mirror circuit, which is structured so that the current conducted to the transistor 519 and to the transistor 520 would be the same.

A transistor 521 is a P-channel transistor, and a transistor 522 is an N-channel transistor.

Capacitors 523 and 524 are capacitors for the output phase compensation of the operational amplifier 7 of the present invention.

The transistors 521 and 522 and the capacitors 523 and 524 form an output unit.

The gate of the transistor 521 is connected to the drain of the transistor 513. The drain of the transistor 521 is connected to the terminal OUT 506. The source of the transistor 521 is connected to the terminal VDD 501. The gate of the transistor 522 is connected to the drain of the transistor 518. The drain of the transistor 522 is connected to the terminal OUT 506. The source of the transistor 522 is connected to the terminal VSS 503.

A terminal on each of capacitors 523 and 524 are respectively connected to the gate of the transistor 521 and the gate of the transistor 522, respectively, and the other terminals on capacitors 523 and 524 are connected to the terminal OUT 506. The capacitors 523 and 524 may be omitted.

A transistor 525 is a P-channel transistor, and a transistor 526 is an N-channel transistor. The transistors 525 and 526 form an offset current generation circuit 6.

The gate of the transistor 525 is connected to the terminal OFF_P 507. The drain of the transistor 525 is connected to the terminal OUT 506. The source of the transistor 525 is connected to the terminal VDD 501. The gate of the transistor 526 is connected to the terminal OFF_N 508. The drain of the transistor 526 is connected to the terminal OUT 506. The source of the transistor 526 is connected to the terminal VSS 503.

The present invention provides the following. A circuit device for display devices in which adjacent outputs are of opposite polarities and the output of the operational amplifier 7 can be linear within the power supply voltage range.

Current short circuits in the input selection circuit 3 can be prevented when polarities invert.

Circuits can be made smaller because transistors with a dielectric strength being half of the power supply voltage can be used in the input selection circuit 3.

Circuits can be made smaller because transistors with a dielectric strength being a fraction of the power supply voltage can be used in the input selection circuit 3.

Circuits can be made smaller because there is no driving based on capacitive coupling.

An appropriate offset current can be generated in the non-linear operation region of the operational amplifier 7.

Due to fact that the operational amplifier 7 is formed from both P-channel and N-channel transistors, it has good precision. Because the precision is guaranteed, the size of the differential unit in the operational amplifier 7 can be generally the same as that of the conventional differential unit, which allows the size of the circuit to be smaller.

Due to the fact that the output can linearly follow the input within the power supply voltage range, there is no need to use switches and a high-speed operation can be achieved. Also, due to the fact that there is no need to lower the threshold voltage of transistors, the dielectric strength of transistors can be made larger.

Also, since a constant current is conducted only when the offset current is generated, less current is required.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A display drive apparatus for driving liquid crystals by applying a voltage to the liquid crystals based on gray-scale data representative of a display, the apparatus comprising:

a polarity control circuit that generates a polarity control signal based on a polarity signal;

an input selection circuit that selects a predetermined reference voltage for driving the liquid crystals from a plurality of reference voltages provided from an input voltage generation circuit or a plurality of reference voltages generated within the input selection circuit based on an input signal representative of gray-scale data and the polarity control signal;

a non-linear operation region identifying circuit that identifies a non-linear operation region in which an output signal from an operational amplifier does not follow an input thereto based on the input signal and the polarity control signal, and outputs an offset current generation control signal for supplementing the current of the output signal of the operational amplifier when an input voltage in the non-linear operation region is subjected to an operation amplification, wherein the operational amplifier inputs the predetermined reference voltage selected by the input selection circuit and outputs at an output terminal an output signal that is operation-amplified according to the predetermined reference voltage; and an offset current generation circuit that supplements the current at the output terminal of the operational amplifier based on the offset current generation control signal outputted from the non-linear operation region identifying circuit.

2. The display drive apparatus according to claim 1, wherein the non-linear operation region identifying circuit outputs the offset current generation control signal in such a manner that an amount of offset current is varied depending on a degree of deviation from a linearity of an input/output characteristic of the operational amplifier.

3. The display drive apparatus according to claim 2, wherein the non-linear operation region identifying circuit determines the offset current generation control signal based on the value of an input signal of gray-scale data.

4. The display drive apparatus according to claim 3, wherein the non-linear operation region identifying circuit inputs an offset voltage that is provided from an offset voltage generation circuit.

5. The display drive apparatus according to claim 3, wherein the non-linear operation region identifying circuit performs a conduction control for a transistor such that the offset voltage is selected when the polarity control signal has a predetermined value, and performs a conduction control for another transistor such that a power supply voltage having a polarity with which the offset current generation circuit does not conduct current is selected when the polarity control signal has a value having an opposite polarity with respect to that of the predetermined value.

6. The display drive apparatus according to claim 1, wherein the polarity control circuit generates polarity control signals including a polarity control signal for even-numbered columns of the display and a polarity control signal for odd-numbered columns of the display.

7. The display drive apparatus according to claim 1, wherein the polarity control circuit generates a polarity control signal for even-numbered columns of the display and a polarity control signal for odd-numbered columns of the display that are mutually in logically inverted relation, depending on a logic level of the polarity control signal, and further comprising a voltage changing circuit.

8. The display drive apparatus according to claim 1, wherein the polarity control circuit inputs a timing signal and outputs the polarity control signal in association with the timing signal.

9. The display drive apparatus according to claim 1, wherein the operational amplifier has a first differential unit and a second differential unit having transistors with mutually opposite polarities, and wherein the offset current generation circuit and the second differential unit perform an amplification operation when an input to the operational amplifier is in a non-linear operation region of the first differential unit; the offset current generation circuit and the first differential unit perform an amplification operation when an input signal to the operational amplifier is in a non-linear operation region of the second differential unit; and the first differential unit and the second differential unit perform an amplification operation in which the first differential unit and the second differential unit mutually supplement one another to provide an output signal when the first differential unit and the second differential unit are both in a linear operation region.

10. The display drive apparatus according to claim 9, wherein the offset current generation circuit is provided within the operational amplifier.

11. The display drive apparatus according to claim 1, wherein
   the operational amplifier includes a differential unit having a P-channel transistor and a differential unit having an N-channel transistor;
   the non-linear operation region identifying circuit and the offset current generation circuit provide an offset current to supply an electric charge to the output terminal of the operational amplifier when the output signal to be provided from the operational amplifier is at a lower potential side, and provides an offset current to withdraw an electric charge from the output terminal when the output signal to be provided from the operational amplifier is at a higher potential side.

12. The display drive apparatus according to claim 1, wherein the display device apparatus is a semiconductor integrated circuit.

13. The display drive apparatus according to claim 1, wherein the display device apparatus is an X-driver.

14. The display drive apparatus according to claim 1, wherein the display device apparatus is a source driver that drives an active matrix type display.

15. A display drive apparatus for driving liquid crystals by applying a voltage to the liquid crystals based on gray-scale data representative of a display, the apparatus comprising:

a polarity control circuit that generates a polarity control signal based on a polarity signal;

an input selection circuit that selects a predetermined reference voltage for driving the liquid crystals from a plurality of reference voltages provided from an input voltage generation circuit or a plurality of reference voltages generated within the input selection circuit based on an input signal representative of gray-scale data and the polarity control signal;

a non-linear operation region identifying circuit that identifies a non-linear operation region in which an output signal from an operational amplifier does not follow an input thereto based on the input signal and the polarity control signal, and outputs an offset current generation control signal for supplementing the current of the output signal of the operational amplifier when an input voltage in the non-linear operation region is subjected to an operation amplification, wherein the operational amplifier inputs the predetermined reference voltage selected by the input selection circuit and outputs at an output terminal an output signal that is operation-amplified according to the predetermined reference voltage; and an offset current generation circuit that supplements the current at the output terminal of the operational amplifier based on the offset current generation control signal outputted from the non-linear operation region identifying circuit, wherein the non-linear operation region identifying circuit determines the offset current generation control signal based on predetermined upper bits of an input signal of gray-scale data and outputs the offset current generation control signal in such a manner that an amount of offset current is varied depending on a degree of deviation from a linearity of an input/output characteristic of the operational amplifier.

16. A display apparatus comprising:

a display drive apparatus for driving liquid crystals by applying a voltage to the liquid crystals based on gray-scale data representative of a display, the apparatus including:

a polarity control circuit that generates a polarity control signal based on a polarity signal;

an input selection circuit that selects a predetermined reference voltage for driving the liquid crystals from a plurality of reference voltages provided from an input voltage generation circuit or a plurality of reference voltages generated within the input selection circuit based on an input signal representative of gray-scale data and the polarity control signal;

a non-linear operation region identifying circuit that identifies a nonlinear operation region in which an output signal from an operational amplifier does not follow an input thereto based on the input signal and the polarity control signal, and outputs an offset current generation control signal for supplementing the current of the output signal of the operational amplifier when an input voltage in the non-linear operation region is subjected to an operation amplification, wherein the operational amplifier inputs the predetermined reference voltage selected by the input selection circuit and outputs at an output terminal an output signal that is operation-amplified according to the predetermined reference voltage; and an offset current generation circuit that supplements the current at the output terminal of the operational amplifier based on the offset current generation control signal outputted from the non-linear operation region identifying circuit; and a liquid crystal display.

17. A hand-carry type electronic apparatus comprising:

a display drive apparatus for driving liquid crystals by applying a voltage to the liquid crystals based on gray-scale data representative of a display, the apparatus including:

a polarity control circuit that generates a polarity control signal based on a polarity signal;

an input selection circuit that selects a predetermined reference voltage for driving the liquid crystals from a plurality of reference voltages provided from an input voltage generation circuit or a plurality of reference voltages generated within the input selection circuit based on an input signal representative of gray-scale data and the polarity control signal;

a non-linear operation region identifying circuit that identifies a nonlinear operation region in which an output signal from an operational amplifier does not follow an input thereto based on the input signal and the polarity control signal, and outputs an offset current generation control signal for supplementing the current of the output signal of the operational amplifier when an input voltage in the non-linear operation region is subjected to an operation amplification, wherein the operational amplifier inputs the predetermined reference voltage selected by the input selection circuit and outputs at an output terminal an output signal that is operation-amplified according to the predetermined reference voltage; and an offset current generation circuit that supplements the current at the output terminal of the operational amplifier based on the offset current generation control signal outputted from the non-linear operation region identifying circuit.

18. A display drive apparatus for driving liquid crystals by applying a voltage to the liquid crystals based on gray-scale data representative of a display, the apparatus comprising:

a polarity control circuit that generates a polarity control signal based on a polarity signal;

an input selection circuit that selects a predetermined reference voltage for driving the liquid crystals from a plurality of reference voltages provided from an input voltage generation circuit or a plurality of reference voltages generated within the input selection circuit based on an input signal representative of gray-scale data and the polarity control signal;

a non-linear operation region identifying circuit that inputs the predetermined reference voltage selected by the input selection circuit and identifies a non-linear operation region in which an output signal from an operational amplifier does not follow an input thereto based on the selected predetermined reference voltage, and outputs an offset current generation control signal for supplementing the current of the output signal of the operational amplifier when an input voltage in the non-linear operation region is subjected to an operation amplification, wherein the operational amplifier inputs the predetermined reference voltage selected by the input selection circuit and outputs at an output terminal an output signal that is operation-amplified according to the predetermined reference voltage; and an offset current generation circuit that supplements the current at the output terminal of the operational amplifier based on the offset current generation control signal outputted from the non-linear operation region identifying circuit.

19. The display drive apparatus according to claim 18, wherein the non-linear operation region identifying circuit outputs an offset current generation control signal in such a manner that an amount of offset current is varied depending on a degree of deviation from a linearity of an input/output characteristic of the operational amplifier.

20. The display drive apparatus according to claim 18, wherein the polarity control circuit generates polarity control signals including a polarity control signal for even-numbered columns of the display and a polarity control signal for odd-numbered columns of the display.

21. The display drive apparatus according to claim 18, wherein the polarity control circuit generates a polarity control signal for even-numbered columns of the display and a polarity control signal for odd-numbered columns of the display that are mutually in logically inverted relation, depending on a logic level of the polarity signal, and further comprising a voltage changing circuit.

22. The display drive apparatus according to claim 18, wherein the polarity control circuit inputs a timing signal and outputs the polarity control signal in association with the timing signal.

23. The display drive apparatus according to claim 18, wherein the operational amplifier has a first differential unit and a second differential unit having transistors with mutually opposite polarities, wherein the offset current generation circuit and the second differential unit perform an amplification operation when an input to the operational amplifier is in a non-linear operation region of the first differential unit; the offset current generation circuit and the first differential unit perform an amplification operation when an input signal to the operational amplifier is in a non-linear operation region of the second differential unit; and the first differential unit and the second differential unit perform an amplification operation in which the first differential unit and the second differential unit mutually supplement one another to provide an output signal when the first differential unit and the second differential unit are both in a linear operation region.

24. The display drive apparatus according to claim 23, wherein the offset current generation circuit is provided within the operational amplifier.

25. The display drive apparatus according to claim 18, wherein
the operational amplifier includes a differential unit having a P-channel transistor and a differential unit having an N-channel transistor;
the non-linear operation region identifying circuit and the offset current generation circuit provide an offset current to supply an electric charge to the output terminal of the operational amplifier when the output signal to be provided from the operational amplifier is at a low potential side, and provides an offset current to withdraw an electric charge from the output terminal when the output signal to be provided from the operational amplifier is at a high potential side.

26. A display driving method for driving a display comprising:
selecting a reference voltage based on gray-scale data:
operation-amplifying the reference voltage to obtain a gray-scale for the display;
changing voltages to be applied to liquid crystals based on the gray scale data to perform a driving operation;
identifying a non-linear operation region in which an output signal from an operational amplifier does not follow an input thereto based on an input signal and a polarity control signal;
outputting an offset current generation control signal for supplementing the current of the output signal of the operational amplifier when an input voltage in the non-linear operation region is subjected to an operation amplification; and
supplementing an output signal from the operational amplifier with an offset current based on the offset current generation control signal when an input to the operational amplifier is at a low potential side or a high potential side.

27. The display driving method according to claim 26, wherein a greater amount of the offset current is generated as an input to the operational amplifier gets closer to a lower potential side or a higher potential side.

28. The display driving method according to claim 26, wherein the operational amplifier includes a differential unit having a P-channel transistor and a differential unit having an N-channel transistor, and wherein an offset current is provided to supply an electric charge to the output terminal of the operational amplifier when the output signal to be provided from the operational amplifier is at a low potential side, and an offset current is provided to withdraw an electric charge from the output terminal when the output signal to be provided from the operational amplifier is at a high potential side.

* * * * *